US012666827B2

(12) United States Patent
Xue et al.

(10) Patent No.: US 12,666,827 B2
(45) Date of Patent: Jun. 23, 2026

(54) DISPLAY PANEL AND DISPLAY DEVICE

(71) Applicant: BOE Technology Group Co., Ltd.,
Beijing (CN)

(72) Inventors: Jinxiang Xue, Beijing (CN);
Zhongyuan Sun, Beijing (CN); **Wenqi
Liu, Beijing (CN); Jingkai Ni**, Beijing
(CN); Che An, Beijing (CN); **Guangcai
Yuan, Beijing (CN); Lu Wang**, Beijing
(CN); Fang Liu, Beijing (CN); **Xiaohu
Li, Beijing (CN); Liangliang Kang**,
Beijing (CN); Zhiqiang Jiao, Beijing
(CN); Peng Wang, Beijing (CN)

(73) Assignee: **BOE TECHNOLOGY GROUP CO.,
LTD.**, Beijing (CN)

( * ) Notice: Subject to any disclaimer, the term of this
patent is extended or adjusted under 35
U.S.C. 154(b) by 579 days.

(21) Appl. No.: 18/245,553

(22) PCT Filed: Jan. 30, 2022

(86) PCT No.: PCT/CN2022/075181
§ 371 (c)(1),
(2) Date: Mar. 16, 2023

(87) PCT Pub. No.: WO2023/142112
PCT Pub. Date: Aug. 3, 2023

(65) Prior Publication Data
US 2024/0324335 A1 Sep. 26, 2024

(51) Int. Cl.
H10K 59/131 (2023.01)
H10K 59/121 (2023.01)
(Continued)

(52) U.S. Cl.
CPC ....... H10K 59/131 (2023.02); H10K 59/1213
(2023.02); H10K 59/1216 (2023.02);
(Continued)

(58) Field of Classification Search
CPC ............ H10K 59/131; H10K 59/1213; H10K
59/1216; H10K 59/122; H10K 59/18;
H10K 59/873; H10K 77/111; H10K
2102/311
See application file for complete search history.

(56) References Cited

U.S. PATENT DOCUMENTS

2020/0403170 A1* 12/2020 Xue ..................... H10K 77/111
2021/0049939 A1 2/2021 Sui et al.
(Continued)

FOREIGN PATENT DOCUMENTS

CN 108878437 A 11/2018
CN 109841660 A 6/2019
(Continued)

OTHER PUBLICATIONS

Written Opinion from PCT/CN2022/075181 dated Oct. 10, 2022.
International Search Report from PCT/CN2022/075181 dated Oct.
10, 2022.

*Primary Examiner* — J. E. Schoenholtz
(74) *Attorney, Agent, or Firm* — Calfee, Halter &
Griswold LLP

(57) ABSTRACT

The present disclosure provides a display panel and a
display device. The display panel includes: a substrate; a
plurality of display units arranged on a side of the substrate,
each of the plurality of display units including at least one
sub-pixel; a plurality of elastic stretching units arranged on
a side of the substrate, each of the plurality of elastic
stretching units being connected between two adjacent dis-
play units, and a plurality of hollow regions being formed
between the plurality of elastic stretching units and the
plurality of display units. A sum of areas of the plurality of
hollow regions is a, a sum of areas of the plurality of display
(Continued)

units is b, and a sum of areas of the plurality of elastic stretching units is c; $15\% \leq a/(a+b+c) \times 100\% \leq 30\%$.

19 Claims, 11 Drawing Sheets

(51) Int. Cl.

| | |
|---|---|
| *H10K 59/122* | (2023.01) |
| *H10K 59/18* | (2023.01) |
| *H10K 59/80* | (2023.01) |
| *H10K 77/10* | (2023.01) |
| *H10K 102/00* | (2023.01) |

(52) U.S. Cl.

CPC ........... *H10K 59/122* (2023.02); *H10K 59/18* (2023.02); *H10K 59/873* (2023.02); *H10K 77/111* (2023.02); *H10K 2102/311* (2023.02)

(56) References Cited

U.S. PATENT DOCUMENTS

| | | | |
|---|---|---|---|
| 2021/0289621 A1 | 9/2021 | Sano | |
| 2022/0285586 A1* | 9/2022 | Yang | H10H 20/01 |
| 2024/0030236 A1* | 1/2024 | Hu | H10D 86/60 |

FOREIGN PATENT DOCUMENTS

| | | |
|---|---|---|
| CN | 110137239 A | 8/2019 |
| CN | 110444575 A | 11/2019 |
| CN | 110459568 A | 11/2019 |
| CN | 110751902 A | 2/2020 |
| CN | 11653593 A | 9/2020 |
| CN | 111653593 A | 9/2020 |
| CN | 111834406 A | 10/2020 |
| CN | 112150934 A | 12/2020 |
| CN | 113031809 A | 6/2021 |
| CN | 109841660 B | 8/2021 |

* cited by examiner

DISPLAY PANEL AND DISPLAY DEVICE

The present application is a 371 application of PCT Application No. PCT/CN2022/075181, filed on Jan. 30, 2022, contents of which are incorporated by reference herein in its entirety.

TECHNICAL FIELD

The present disclosure relates to the display technical field, and in particular, to a display panel and a display device.

BACKGROUND

With the developments of display technologies, increasingly high bending requirements for display products are raised. At present, in bendable display products, substrates, circuit layers, especially inorganic layers or other film structures in display devices have certain bendability. But, the amount of stretchability is extremely limited. During the stretching procedure, breakage or irreversible deformation is easy to happen.

It should be noted that the information disclosed in the background section above is only used to enhance the understanding of the background of the present disclosure, and therefore may include information that does not constitute the prior art known to those skilled in the art.

SUMMARY

The present disclosure aims at providing a display panel. The display panel of embodiments of the present disclosure can not only satisfy the stress release requirement during a stretching procedure, but also ensure the display quality of the display panel.

In order to achieve the above purpose(s), the present disclosure provides the following technical solutions.

According to a first aspect of the present disclosure, there is provided a display panel, including:

a substrate;

a plurality of display units arranged on a side of the substrate, wherein each of the plurality of display units includes at least one sub-pixel;

a plurality of elastic stretching units arranged on a side of the substrate, wherein each of the plurality of elastic stretching units is connected between two adjacent display units, and a plurality of hollow regions are formed between the plurality of elastic stretching units and the plurality of display units;

wherein a sum of areas of the plurality of hollow regions is a, a sum of areas of the plurality of display units is b, and a sum of areas of the plurality of elastic stretching units is c;

$$15\% \leqslant a/(a + b + c) \times 100\% \leqslant 30\%.$$

In an example embodiment of the present disclosure, the elastic stretching units include a plurality of stretching signal lines and at least two conductive layers insulated from each other;

wherein the plurality of stretching signal lines are distributed at least in two of the at least two conductive layers conductive layers.

2

In an example embodiment of the present disclosure, in a direction parallel to a plane where the substrate is located, stretching signal lines distributed in different ones of the conductive layers are staggered.

In an example embodiment of the present disclosure, orthographic projections of the stretching signal lines distributed in different ones of the conductive layers on the substrate do not overlap.

In an example embodiment of the present disclosure, each of the elastic stretching units includes:

a first insulating layer arranged on a side of the substrate;

a first conductive layer arranged on a side of the first insulating layer away from the substrate;

a second insulating layer arranged on a side of the first conductive layer away from the substrate, wherein the second insulating layer covers a surface of the first conductive layer;

a second conductive layer arranged on a side of the second insulating layer away from the substrate; and stretching signal lines including a first stretching signal line and a second stretching signal line, wherein the first stretching signal line is distributed in the first conductive layer, and the second stretching signal line is distributed in the second conductive layer, orthographic projections of the first stretching signal line and the second stretching signal line on the substrate do not overlap.

In an example embodiment of the present disclosure, at least one of the elastic stretching units includes a plurality of sub-stretching units spaced from each other, and each of the plurality of sub-stretching units includes at least one stretching signal line and at least one conductive layer, the at least one stretching signal line is distributed in at least one conductive layer, and each conductive layer includes at most one stretching signal line.

In an example embodiment of the present disclosure, each of the plurality of sub-stretching units includes one conductive layer, and the conductive layer includes one stretching signal line;

wherein each of the plurality of sub-stretching units further includes:

a first insulating layer arranged between the substrate and the conductive layer; and a second insulating layer arranged on a side of the conductive layer away from the substrate.

In an example embodiment of the present disclosure, each of the display units includes:

a driving circuit layer arranged on one side of the substrate; and a light-emitting layer arranged on a side of the driving circuit layer away from the substrate, wherein the light-emitting layer includes a pixel-defining structure and at least one light-emitting device;

wherein the pixel-defining structure defines at least one sub-pixel region, and each of the at least one sub-pixel region is provided with one of the at least one light-emitting device.

In an example embodiment of the present disclosure, each of the at least one light-emitting device includes a first electrode layer, a light-emitting functional layer and a second electrode layer which are sequentially stacked along a direction away from the substrate;

wherein the driving circuit layer includes:

an active layer arranged on a side of the substrate;

a first gate insulating layer arranged on a side of the active layer away from the substrate, wherein the first gate insulating layer covers the active layer;

a first gate metal layer arranged on a side of the first gate insulating layer away from the substrate, wherein the first gate metal layer includes a first electrode plate of a capacitor and a gate of a transistor;

a second gate insulating layer arranged on a side of the first gate metal layer away from the substrate, wherein the second gate insulating layer covers the first gate metal layer;

a second gate metal layer arranged on a side of the first gate insulating layer away from the substrate and arranged opposite to the first electrode plate, wherein the second gate metal layer includes a second electrode plate of the capacitor;

an interlayer dielectric layer arranged on a side of the second gate metal layer away from the substrate, wherein the interlayer dielectric layer covers the second gate metal layer;

a first source and drain layer arranged on a side of the interlayer dielectric layer away from the substrate, wherein the first source and drain layer includes a source and a drain of a transistor, and the source and drain are connected to the active layer;

wherein the first source and drain layer further includes a plurality of signal lines, the signal lines include a voltage signal line, and the voltage signal line is connected to the second electrode layer.

In an example embodiment of the present disclosure, when each of the elastic stretching units includes at least two conductive layers insulated from each other, a thickness of an insulating layer between two adjacent ones of the at least two conductive layers is gradually thinned in an extending direction from the elastic stretching unit to a corresponding display unit;

wherein the plurality of stretching signal lines in each of the elastic stretching units extend to inside of the display unit to form the plurality of the signal lines in the display unit;

wherein the plurality of signal lines located in the display unit are arranged in a tiled manner spaced from each other in a direction parallel to a plane where the substrate is located.

In an example embodiment of the present disclosure, each of the at least one light-emitting device includes a first electrode layer, a light-emitting functional layer and a second electrode layer which are sequentially stacked along a direction away from the substrate;

wherein the display panel further includes:

an encapsulation layer arranged on a side of the light-emitting layer away from the substrate;

a first connecting conductor layer arranged on a side of the encapsulation layer away from the substrate, wherein the first connecting conductor layer is connected to the second electrode layer;

a cover plate arranged on a side of the first connecting conductor layer away from the substrate, wherein the cover plate is provided with a second connecting conductor layer, the second connecting conductor layer is located on a surface of the cover plate close to the substrate, the second connecting conductor layer is connected to the first connecting conductor layer, and the second connecting conductor layer is used for transmitting a voltage signal.

In an example embodiment of the present disclosure, the display panel further includes at least one conductive ball, and the second connecting conductor layer is connected to the first connecting conductor layer through the at least one conductive ball.

In an example embodiment of the present disclosure, all light-emitting devices in each display unit form a light-emitting device group;

wherein the pixel-defining structure includes:

a first defining structure arranged on the periphery of the light-emitting device group;

wherein in a direction perpendicular to a plane where the substrate is located, an orthographic projection of a bottom end of the first defining structure on the substrate is located within an orthographic projection of a middle or top end of the first defining structure on the substrate.

In an example embodiment of the present disclosure, the pixel-defining structure further includes:

at least one second defining structure, each of which is arranged between two adjacent light-emitting devices in a corresponding one of the display units;

wherein in the direction perpendicular to the plane where the substrate is located, a height of the first defining structure is greater than a height of the least one second defining structure second defining structure.

In an example embodiment of the present disclosure, in the direction perpendicular to the plane where the substrate is located, a cross section of the first defining structure is an inverted trapezoid.

In an example embodiment of the present disclosure, all light-emitting devices in each display unit form a light-emitting device group;

wherein the pixel-defining structures includes:

a first defining structure arranged on the periphery of the light-emitting device group, wherein the first defining structure includes a first defining portion and a second defining portion connected to each other, the first defining portion is connected to a side of the second defining portion close to the substrate, an orthographic projection of the first defining portion on the substrate is located within an orthographic projection of the second defining portion on the substrate, and an area of the orthographic projection of the first defining portion on the substrate is smaller than an area of the orthographic projection of the second defining portion on the substrate.

In an example embodiment of the present disclosure, at least a partial region of the elastic stretching units is a curved structure.

In an example embodiment of the present disclosure, two adjacent display units are arranged along a first direction;

wherein:

each of the elastic stretching units includes a first connecting portion, a second connecting portion and a third connecting portion which are smoothly connected in sequence;

the first connecting portion and the third connecting portion extend along the first direction;

the first connecting portion has a first connecting end, the third connecting portion has a second connecting end, the first connecting end is connected to one of the two adjacent display units, the second connecting end is connected to the other one of the two adjacent display units, and the first connecting end and the second connecting end are located at both sides of a center point connecting line for connecting center points of the two adjacent display units;

an extending direction of the second connecting portion is not perpendicular to the center point connecting line for connecting the center points of the two adjacent display units.

In an example embodiment of the present disclosure, the second connecting portion is linear, and an included angle between the extending direction of the second connecting portion and the center point connecting line for connecting the center points of the two adjacent display units is $\alpha$, $45°\leq\alpha<90°$.

In an example embodiment of the present disclosure, the plurality of the display units include:

a plurality of first display units; and a plurality of second display units which are respectively connected to the first display units through the elastic stretching units, wherein the second display units and first display units are spaced from each other;

wherein an edge of each of the first display units is linear, and an edge of each of the second display units is curved.

In an example embodiment of the present disclosure, each of the elastic stretching units has a first connecting end and a second connecting end;

the first connecting end is connected to a first display unit in the first display unit and a second display unit which are adjacent;

the second connecting end is connected to the second display unit in the first display unit and the second display unit which are adjacent;

the first connecting end and the second connecting end are at both sides of a center point connecting line for connecting center points of the first display unit and the second display unit;

each of the elastic stretching units has at least a partial region which is a curved structure extending along a bending direction of the edge of the second display unit.

In an example embodiment of the present disclosure, each of the hollow regions is arranged at a center of four of the display units distributed in a square shape;

wherein the hollow region is windmill-shaped.

In an example embodiment of the present disclosure, two adjacent display units are arranged along a first direction; wherein:

each of the elastic stretching units includes a third connecting portion, a fourth connecting portion and a fifth connecting portion that are smoothly connected in sequence;

the third connecting portion and the fifth connecting portion extend along the first direction;

the third connecting portion has a third connecting end, the fifth connecting portion has a fourth connecting end, the third connecting end is connected to one of the two adjacent display units, the four connecting end is connected to the other one of the two adjacent display units, and the third connecting end and the fourth connecting end are located on a center point connecting line for connecting center points of the two adjacent display units;

the fourth connecting portion is a curved structure.

In an example embodiment of the present disclosure, the substrate includes a first portion and a plurality of second portions embedded in the first portion and spaced from each other;

wherein:

a rigidity of each of the second portions is greater than a rigidity of the first portion; and an orthographic projection of each of the display units on the substrate is at least partially located within a corresponding second portion.

In an example embodiment of the present disclosure, the first portion is provided with a plurality of first grooves spaced from each other, and the first grooves are opened at a side of the substrate close to the display units, and the second portions are distributed in the first grooves in a one-to-one correspondence.

In an example embodiment of the present disclosure, the second portion is provided with a plurality of through holes penetrating the substrate and spaced from each other, and the second portions are distributed inside the through holes in a one-to-one correspondence.

In an example embodiment of the present disclosure, the first portion is provided with a plurality of second grooves spaced from each other.

In an example embodiment of the present disclosure, the substrate includes:

a bottom film layer;

a pressure-sensitive adhesive layer arranged on a side of the bottom film layer;

a flexible material layer arranged on a side of the pressure-sensitive adhesive layer away from the bottom film layer, wherein the flexible material layer includes a first flexible unit and a second flexible unit spaced from each other;

wherein an orthographic projection of each of the display units on the substrate is located in the first flexible unit, and an orthographic projection of each of the elastic stretching units on the substrate at least partially overlaps with the second flexible unit.

According to a second aspect of the present disclosure, there is provided a display device, including the display panel according to the first aspect.

In the display panel provided by embodiments of the present disclosure, each of the elastic stretching units is connected between two adjacent display units, and a plurality of hollow regions are formed between the plurality of elastic stretching units and the plurality of display units. During the stretching procedure of the display panel, the stress can be released through the hollow regions, thereby avoiding the breakage of layer structures of the display panel. Thus, the technical solutions can improve the stretch rate and service life of the overall display panel. The area of the hollow regions accounts for a percentage of the total area of the three (the total area of the hollow regions, the display units and the elastic stretching units). Within this range, the hollow regions can not only meet the stress release requirement during the stretching procedure, but also ensure the display quality of the display panel.

BRIEF DESCRIPTION OF THE DRAWINGS

The above and other features and advantages of the present disclosure will become more apparent from the detailed descriptions of example embodiments with reference to accompanying drawings.

Figure 1:
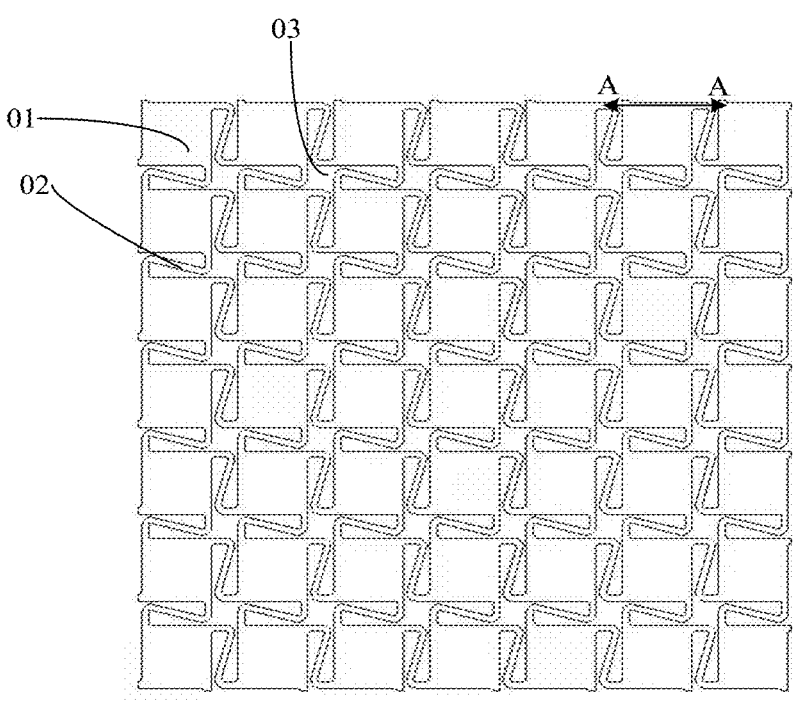
FIG. 1 is a schematic diagram of a planar structure of a display panel in an example embodiment of the present disclosure.

Reference signs of main components in the drawings are explained as follows: 001: substrate; 010: first portion; 10a: first groove; 10b: through hole; 10c: second groove; 011: second portion; 012: bottom film layer; 013: pressure sensitive adhesive layer; 014: flexible material layer; 14a: first flexible unit; 14b: second flexible unit; 01: display unit; 01a: first display unit; 01b: second display unit; 10: driving circuit layer; 101: active layer; 102: first gate insulating layer; 103: first gate metal layer; 104: second gate insulating layer; 105: second gate metal layer; 106: interlayer dielectric layer; 107: first source and drain layer; 108: passivation layer; 109: planarization layer; 1091: first covering layer; 11: light-emitting layer; 110: light-emitting device; 1100: light-emitting device group; 1101: first electrode layer; 1102: light-emitting functional layer; 111: pixel-defining structure; 1111: first defining structure; 11a: first defining portion; 11b: second defining portion; 1112: second defining structure; 112: first electrode covering layer; 12: signal line; 13: light shielding layer; 14: buffer layer; 02: elastic stretching unit; 021: sub-stretching unit; 20: stretching signal line; 201: first stretching signal line; 202: second stretching signal line; 21: conductive layer; 211: first conductive layer; 212: second conductive layer; 22: first insulating layer; 23: second insulating layer; 24: third insulating layer; 241: first inorganic layer; 242: second inorganic layer; 25: first connecting portion; 26: second connecting portion; 27: third connecting portion; 28: fourth connecting portion; 29: fifth connecting portion; 291: sixth connecting portion; 03: hollow region; 04: encapsulation layer; 05: first connecting conductor layer; 06: cover plate; 61: second connecting conductor layer; 07: conductive ball.

DETAILED DESCRIPTION

Example embodiments will now be described more fully with reference to the accompanying drawings. However, the example embodiments can be implemented in various forms and should not be construed as limited to the examples set forth herein; rather, providing these embodiments makes the present disclosure more comprehensive and complete, and conveys the concepts of the example embodiments comprehensively to those skilled in the art. The described features, structures, or characteristics may be combined in any suitable manner in one or more embodiments. In the following description, numerous specific details are provided in order to give a thorough understanding of the embodiments of the present disclosure.

In the drawings, the thicknesses of regions and layers may be exaggerated for clarity. The same reference numerals in the drawings denote the same or similar structures, and thus their repeated descriptions will be omitted.

The described features, structures, or characteristics may be combined in any suitable manner in one or more embodiments. In the following descriptions, numerous specific details are provided in order to give a thorough understanding of embodiments of the present disclosure. However, one skilled in the art will appreciate that the technical solutions of the present disclosure may be practiced without one or more of the specific details, or that other methods, components, materials, etc. may be employed. In other instances, well-known structures, materials, or operations are not shown or described in detail to avoid obscuring the main technical idea of the present disclosure.

When a structure is "on" another structure, it may mean that the structure is integrally formed on the another structure, or that the structure is "directly" arranged on the another structure, or that the structure is "indirectly" arranged on the another structure through other structure(s).

The terms "a", "an" and "the" are used to indicate the presence of one or more elements/components/etc. The terms "includes/include" and "have/has" are used to indicate open-ended inclusion and to mean that additional elements/components/etc. may exist in addition to the listed elements/components/etc. The terms "first" and "second" are used as markers only and are not quantitative restrictions on their associated objects.

An embodiment of the present disclosure provides a display panel, including: a substrate 001; a plurality of display units 01 arranged on a side of the substrate, wherein each of the plurality of display units 01 includes at least one sub-pixel; a plurality of elastic stretching units 02 arranged on a side of the substrate 001, wherein each of the plurality of elastic stretching units 02 is connected between two adjacent display units 01, and a plurality of hollow regions 03 are formed between the plurality of elastic stretching units 02 and the plurality of display units 01; wherein a sum of areas of the plurality of hollow regions 03 is a, a sum of areas of the plurality of display units 01 is b, and a sum of areas of the plurality of elastic stretching units 02 is c; $15\% \leq a/(a+b+c) \times 100\% \leq 30\%$.

In the display panel provided by embodiments of the present disclosure, each of the elastic stretching units 02 is connected between two adjacent display units 01, and a plurality of hollow regions 03 are formed between the plurality of elastic stretching units 02 and the plurality of display units 01. During the stretching procedure of the display panel, the stress can be released through the hollow regions 03, thereby avoiding the breakage of layer structures of the display panel. Thus, the technical solutions can improve the stretch rate and service life of the overall display panel. The area of the hollow regions 03 accounts for 15%-30% of the total area of the three (the total area of the hollow regions, the display units and the elastic stretching units). Within this range, the hollow regions 03 can not only meet the stress release requirement during the stretching procedure, but also ensure the display quality of the display panel.

The components of the display panel provided by the embodiments of the present disclosure will be described in detail below with reference to the accompanying drawings.

As shown in FIGS. 1 to 4, an embodiment provides a display panel. The display panel includes a substrate 001, a plurality of display units 01 and a plurality of elastic stretching units 02. The display units 01 and the elastic stretching units 02 are arranged on a side of the substrate 001. The display units 01 are used for displaying images, and each of the elastic stretching units 02 is connected between two adjacent display units 01.

The substrate 001 may be a single-layer or multi-layer laminated structure, or a plate-like structure formed by splicing various shapes. The material of the substrate 001 may contain one or more kinds. The thickness of the substrate 001 may be 5-200 μm.

Figure 2:
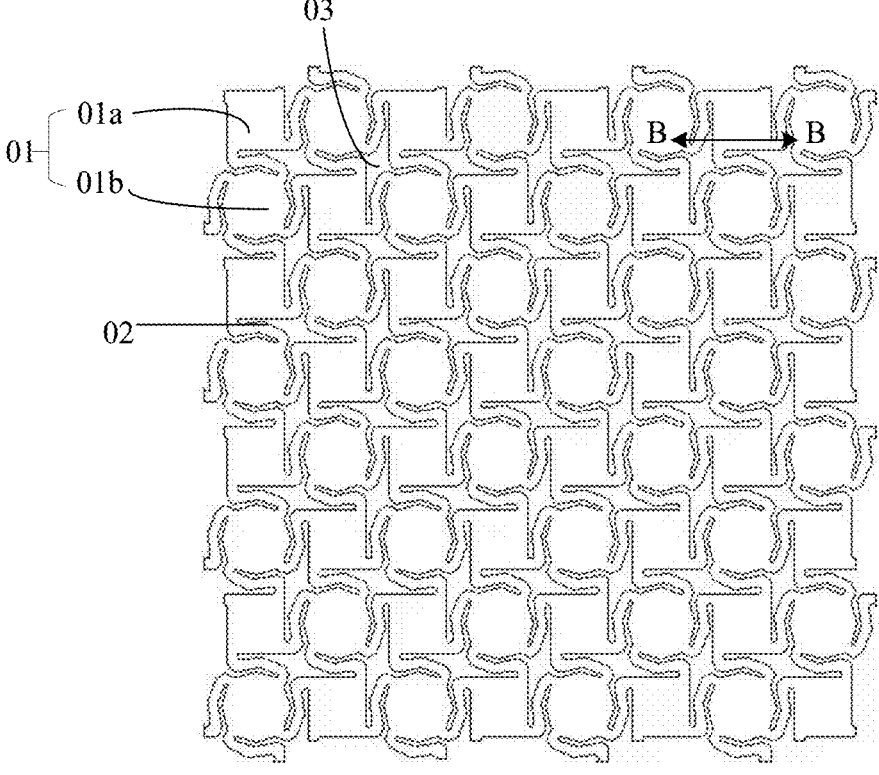
FIG. 2 is a schematic diagram of a planar structure of a display panel in another example embodiment of the present disclosure.
Figure 4:
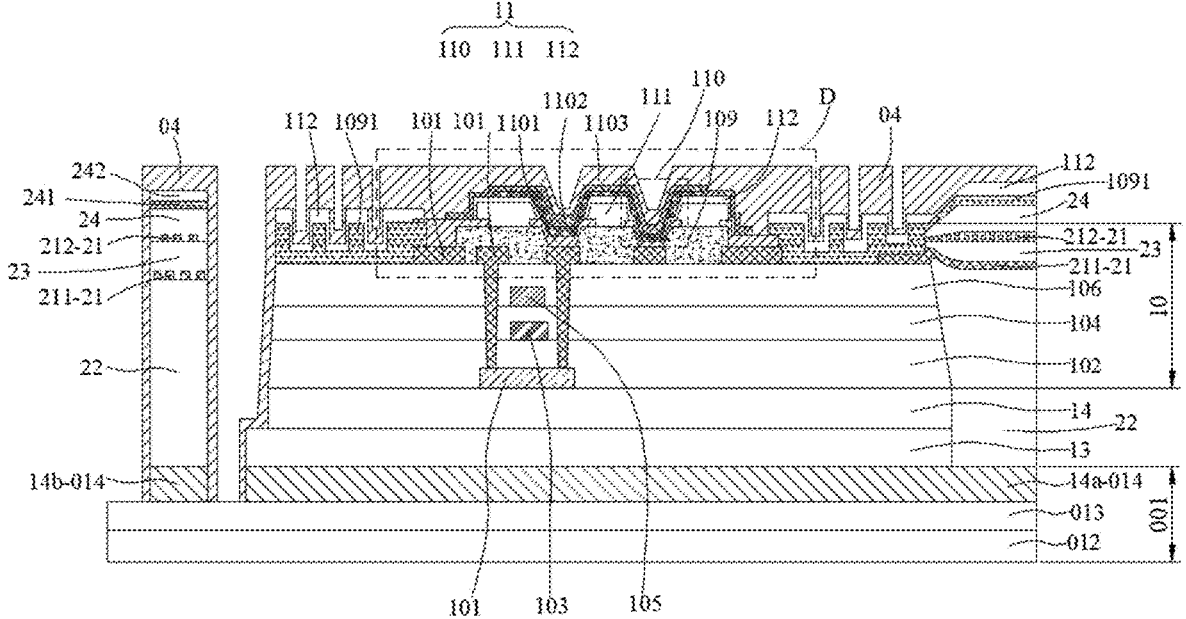
FIG. 4 is a sectional view along A-A direction in FIG. 1.
Figure 6:
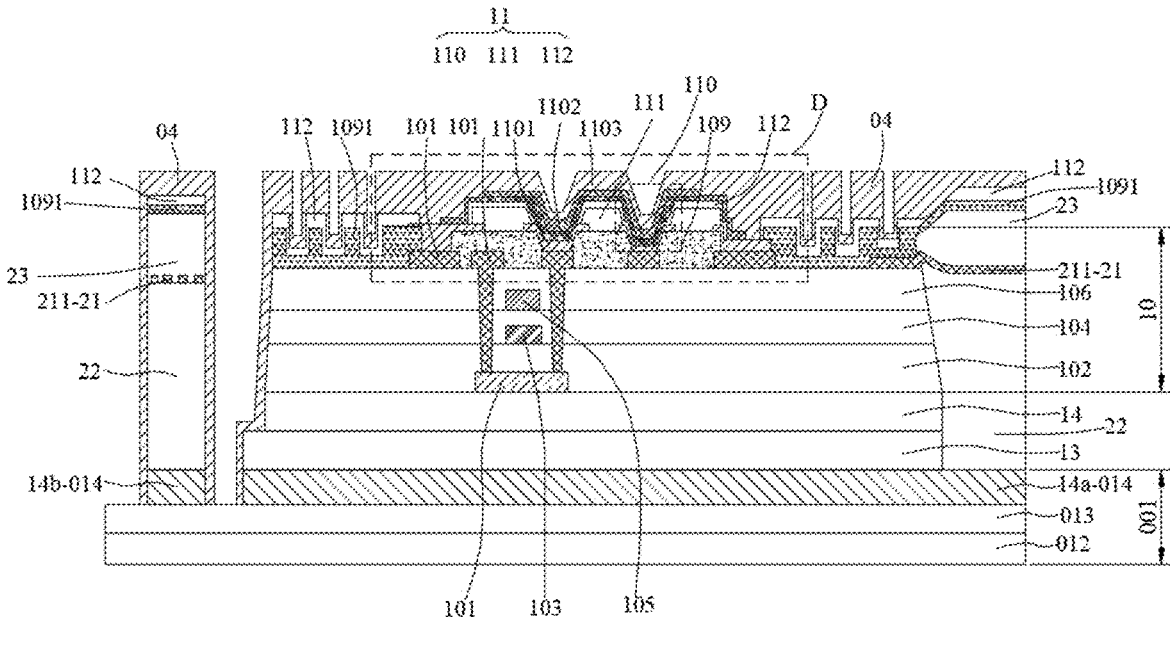
FIG. 6 is a sectional view along B-B direction in FIG. 2.

As shown in FIG. 4 and FIG. 6, FIG. 4 is a schematic cross-sectional view of the A-A direction in FIG. 1, and FIG. 6 is a schematic cross-sectional view of the B-B direction in FIG. 2. In some embodiments of the present disclosure, the substrate 001 is a flexible substrate formed by laminating multiple layers. The substrate 001 may include a bottom film layer 012, a pressure sensitive adhesive layer 013 and a flexible material layer 014. The bottom film layer 012 and the pressure-sensitive adhesive layer 013 corresponding to the display units 01 and the elastic stretching units 02 may be of an integral structure, and the flexible material layer 014 may be of an integral or a separated structure. For example, in one embodiment, the flexible material layer 014 is an integral film layer. In another embodiment, the flexible material layer 014 is a separated structure.

As shown in FIG. 4 and FIG. 6, the flexible material layer 014 includes a first flexible unit 14a and a second flexible unit 14b which are spaced from each other. The orthographic projection of a display unit 01 on the substrate 001 is located inside the first flexible unit 14a, and the orthographic projection of an elastic stretching unit 02 on the substrate 001 at least partially overlaps with the second flexible unit 14b. That is, the display unit 01 is arranged on a side of the first flexible unit 14a. A partial region of the elastic stretching unit 02 may be arranged on a side of the second flexible unit 14b, and a partial region may be arranged on a side of the second flexible unit 14b. Alternatively, the entire elastic stretching unit 02 may be all arranged on a side of the second flexible unit 14b. In such embodiments, dividing the flexible material layer 014 of the substrate 001 helps to increase the elongation rate of the substrate 001 during stretching. On the one hand, such embodiments can prevent the substrate 001 from breaking during stretching. On the other hand, the embodiments can also avoid peeling between various film layers of the substrate 001.

The material of the bottom film layer 012 may be selected from materials with high elasticity, such as dimethyl siloxane, polyimide, polyethylene terephthalate and the like. The pressure-sensitive adhesive layer 013 may be made of acrylic based material, silicon based material or other adhesive materials. The flexible material layer 014 may be made of polyimide, polyethylene terephthalate, metal or other flexible materials.

Figure 10:
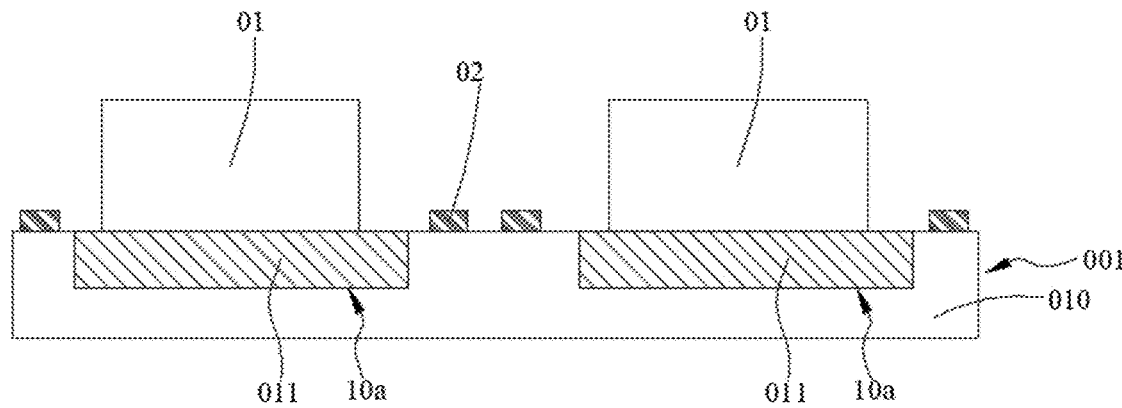
FIG. 10 is a schematic diagram of a substrate structure in an example embodiment of the present disclosure.
Figure 11:
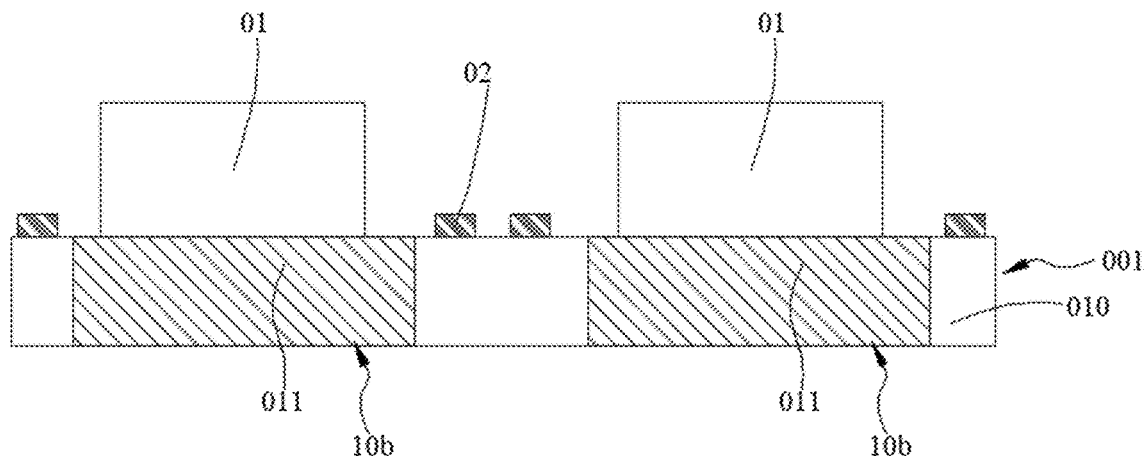
FIG. 11 is a schematic diagram of a substrate structure in another example embodiment of the present disclosure.
Figure 12:
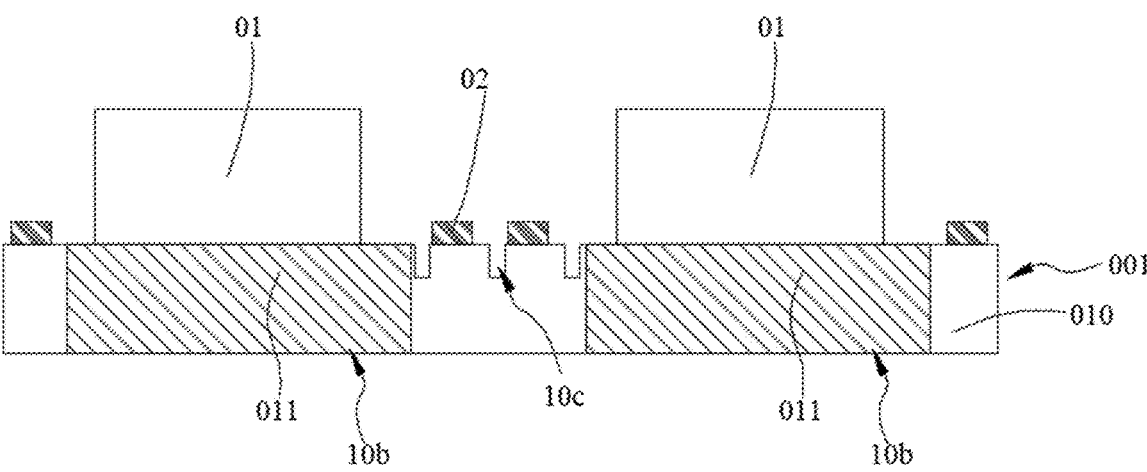
FIG. 12 is a schematic diagram of a substrate structure in another example embodiment of the present disclosure.

As shown in FIG. 10 to FIG. 12, in some other embodiments of the present disclosure, the substrate 001 may be a plate-shaped structure formed by connecting structures of different shapes. For example, in one embodiment, the substrate 001 includes a first portion 010 and a plurality of second portions 011 embedded in the main body and spaced from each other. The rigidity of the second portions 011 is greater than that of the first portion 010. The orthographic projection of the display unit 01 on the substrate 001 is located at least partially within a corresponding second portion 011. Preferably, entire of the orthographic projection of the display unit 01 on the substrate 001 is located in the second portion 011. That is, the display unit 01 is located above the second portion 011 of the substrate 001. It should be noted here that FIGS. 10 to 12 only schematically illustrate the structure of the substrate 001, and the shown patterns of the display units 01 and the elastic stretching units 02 in the figures do not constitute a limitation on the present disclosure.

In practical applications, when the display panel is stretched, the substrate 001 will be deformed with the external force, and film layers in the display units 01 will be deformed with the deformation of the substrate 001. The substrate 001 includes the first portion 010 and the second portions 011. The rigidity of the second portions 011 is greater than that of the first portion 010. Therefore, the deformation generated by the second portions 011 is small, and film layer structures in the display units 01 located above the second portions are less prone to peeling during the stretching procedure, which helps to improve the reliability of the display units 01.

Adjusting the material selection of the second portions 011 and the first portion 010 may make rigidity of the second portions 011 greater than that of the first portion 010. For example, the elastic modulus of the material of the second portions 011 may be smaller than the elastic modulus of the material of the first portion 010. For example, the material of the second portions 011 may include polyimide (PI), and the material of the first portion 010 may include Polydimethylsiloxane (PMDS).

Furthermore, the second portions 011 may have various shapes. On a plane parallel to the plane where the substrate 001 is, the cross section of the second portions 011 may be a geometric polygon, a curved edge shape, or an irregular closed shape, and so on, which are not limited in embodiments of the present disclosure. In practical applications, the shape of the second portions may be set according to the shape and size of the display units 01.

There may be various specific ways of distributing the second portions 011 in the first portion 010.

As shown in FIG. 10, in one embodiment, the first portion 010 is provided with a plurality of first grooves 10a which are spaced from each other. The first grooves 10a are opened at a side of the substrate 001 close to the display units 01. That is, the openings of the first grooves 10a open toward the display units 01. The plurality of second portions 011 are distributed in the first grooves 10*a* in a one-to-one corre-spondence. That is, the second portions 011 correspond to the first grooves 10*a* one-to-one. In this embodiment, the first portion 010 wraps the second portions 011 therein. The shape and size of the first grooves 10*a* may be set according to the shape of the second portions 011, so that the second portions 011 may be properly embedded in the first grooves 10*a*. Further, the connections between the second portions 011 and the first portion 010 may be done through a pressure-sensitive adhesive or the like.

As shown in FIG. 11, in another embodiment, the second portion 011 is provided with a plurality of through holes 10*b* spaced from each other and penetrating the substrate 001. The through holes 10*b* may have various shapes. On a plane parallel to the plan where the substrate 001 is, the cross-section of the through hole 10*b* may be polygonal or curved, or an irregular closed shape, which is not limited in embodi-ments of the present disclosure. The plurality of second portions 011 are distributed in the through holes 10*b* in one-to-one correspondence. That is, the second portions 011 correspond to the through holes 10*b* one-to-one. The shape and size of the through holes 10*b* may be set according to the shape of the second portions 011, so that the second portions 011 may be properly embedded in the through holes 10*b*. Further, the connections between the second portions 011 and the first portion 010 may be done through a pressure-sensitive adhesive or the like.

In addition, other ways can be used to further improve the performance of the substrate 001 during stretching. As shown in FIG. 12, in some embodiments of the present disclosure, the first portion 010 is further provided with a plurality of second grooves 10*c* spaced from each other. The distribution positions of the second grooves 10*c* in the first portion 010 are not limited, and the second grooves 10*c* may be distributed around the second portions 011, or may be randomly distributed in other positions of the first portion 010 and spaced from each other. Preferably, the second grooves 10*c* may be distributed at positions with larger deformation during stretching. In a specific embodiment, the second grooves 10*c* are opened on a surface of the substrate 001 close to the display units 01. The number and size of the second grooves 10*c* may be set according to actual condi-tions. On a plane parallel to the plane where the substrate 001 is, the width of a second groove 10*c* is 1-10 m. In a direction perpendicular to the plane where the substrate 001 is, the depth of a second groove 10*c* is 2-20 m. In this embodiment, the second grooves 10*c* can largely reduce the deformation of the second portions 011 when stretched, further improving the reliability of the display units 01.

Figure 3:
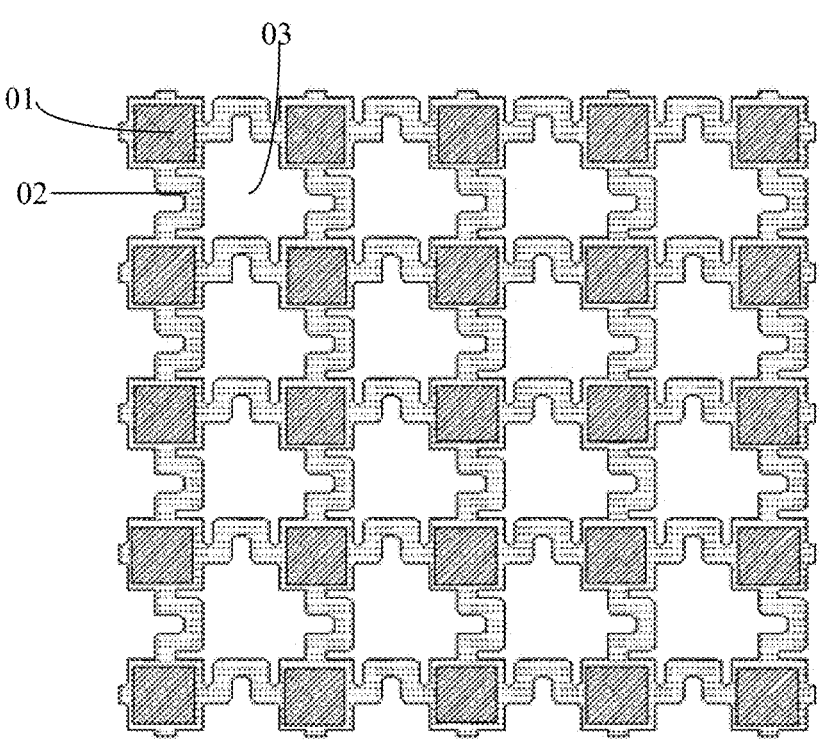
FIG. 3 is a schematic diagram of a planar structure of a display panel in another example embodiment of the present disclosure.

As shown in FIGS. 1 to 3, the display panel includes a plurality of display units 01 and a plurality of elastic stretching units 02. Each display unit 01 includes at least one sub-pixel. Specifically, each display unit 01 may include one, two or more sub-pixels for realizing a display function. In some embodiments, a display unit 01 may include an Organic Light-Emitting Diode (OLED), an inorganic Light-Emitting Diode (LED) or a Quantum dot Light-Emitting Diode (QLED), and so on.

The plurality of display units 01 and the plurality of elastic stretching units 02 are arranged on a side of the substrate 001. Each of the elastic stretching units 02 is connected between two adjacent display units 01. A plurality of hollow regions 03 are formed between the plurality of elastic stretching units 02 and the plurality of display units 01. During the stretching procedure of the display panel, the stress can be released through the hollow regions 03, so as to avoid the breakage of layer structures of the display panel, thus improving the stretch rate and service life of the overall display panel.

In an embodiment of the present disclosure, the sum of the areas of the plurality of hollow regions 03 is a, the sum of the areas of the plurality of display units 01 is b, and the sum of the areas of the plurality of elastic stretching units 02 is c;

$$15\% \leq a/(a+b+c) \times 100\% \leq 30\%.$$

Within this range, the hollow regions 03 can not only meet the stress release requirement during the stretching proce-dure, but also ensure the display quality of the display panel. Specifically, the ratio may be 15%, 16%, 17%, 18%, 19%, 20%, 21%, 22%, 23%, 24%, 25%, 26%, 27%, 28%, 29% % or 30%, and embodiments of the present disclosure are not limited to this.

In some embodiments of the present disclosure, the stretchability and display quality of the display panel can be further improved by changing the structure of the elastic stretching units 02 or the display units 01.

In some embodiments of the present disclosure, the stretch rate of the display panel is further improved by changing the structure of the elastic stretching units 02.

As shown in FIG. 4, FIG. 6, FIG. 7, and FIG. 9, FIG. 7 and FIG. 9 are schematic diagrams of the laminated structure of an elastic stretching unit on the substrate 001. The elastic stretching unit 02 includes a plurality of stretching signal lines 20. A driver chip of the display panel may drive display units 01 through the stretching signal lines 20 in the elastic stretching unit 02, so that the display units 01 can realize display. The plurality of stretching signal lines 20 in the elastic stretching unit 02 may be used to transmit various signals, such as a power supply voltage signal, a light-emitting control signal, a scan signal, or a reset signal. One stretching signal line 20 may be used to transmit one or more kinds of signals, which is not limited in the present disclo-sure.

Figure 7:
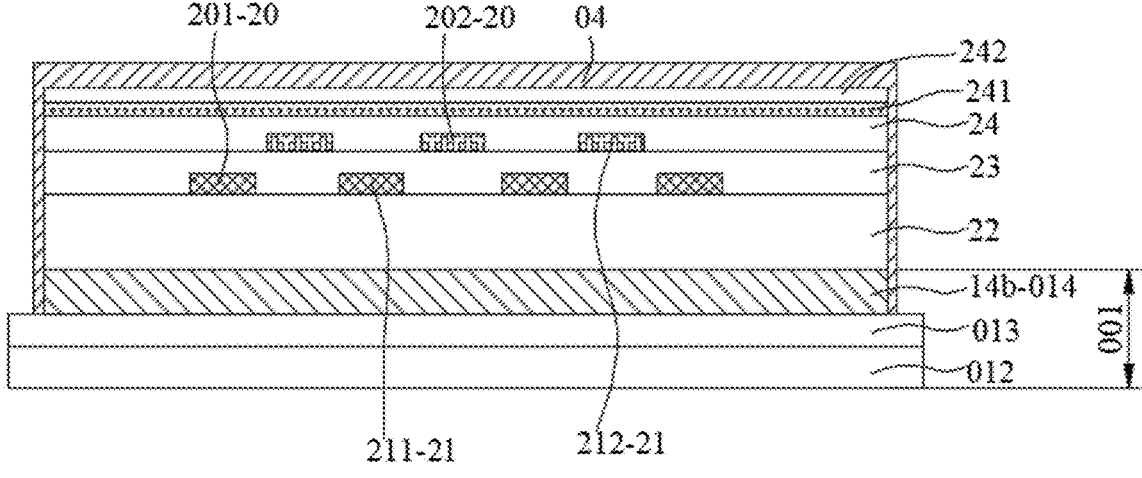
FIG. 7 is a schematic diagram of a film layer structure of an elastic stretching unit in an example embodiment of the present disclosure.

As shown in FIG. 4 and FIG. 7, in some embodiments of the present disclosure, the stretch rate of the elastic stretch-ing unit 02 is improved by changing the lamination structure of the elastic stretching unit 02. The elastic stretching unit 02 includes a plurality of stretching signal lines 20 and at least two mutually insulated conductive layers 21. Specifically, the number of conductive layers 21 may be two, three or more. The plurality of stretching signal lines 20 are distrib-uted in at least two layers of conductive layers 21, so as to reduce the space occupied by the plurality of stretching signal lines 20 as a whole in the direction in which the stretching signal lines 20 are arranged, and further reduce the width of the elastic stretching unit in the direction in which the stretching signal lines 20 are arranged, and thereby improving the stretch rate of the elastic stretching unit. The material of the conductive layers 21 may be conductive metals such as Ti, Al, Mo, Ag, or conductive oxides such as ITO, IZO, ZnO, $In_2O_3$, IGO, AZO, or materials with high ductility such as rubber mixed with conductive particles, or carbon nanotubes, etc.

Further, in a direction parallel to the plane where the substrate 001 is located, the stretching signal lines 20 distributed in different conductive layers 21 are staggered. That is, the stretching signal lines 20 distributed in one conductive layer 21 and the stretching signal lines 20 distributed in another conductive layer 21 are staggered. In this way, the parasitic capacitance between the stretching signal lines 20 in different layers can be reduced or eliminated. Preferably, the orthographic projections of the stretching signal lines 20 distributed in different conductive layers 21 on the substrate 001 do not overlap.

In some embodiments of the present disclosure, the elastic stretching unit 02 may further include a plurality of insulating layers. The insulating layers may be located between the conductive layers 21 and the substrate 001, or between the conductive layers 21 and on a side of the conductive layer(s) 21 away from the substrate 001.

For example, as shown in FIG. 4 and FIG. 7, in one embodiment, the elastic stretching unit 02 may include two conductive layers 21, which are respectively a first conductive layer 211 and a second conductive layer 212. The stretching signal lines 20 may include at least one first stretching signal line 201 and at least one second stretching signal line 202. In this embodiment, the elastic stretching unit 02 includes a first insulating layer 22, a first conductive layer 211, a second insulating layer 23 and a second conductive layer 212 which are stacked. The first insulating layer 22 is arranged on a side of the substrate 001. The first conductive layer 211 is arranged on a side of the first insulating layer 22 away from the substrate 001. The second insulating layer 23 is arranged on a side of the first conductive layer 211 away from the substrate 001. The second insulating layer 23 covers a surface of the first conductive layer 211 to ensure the insulating effect. The second conductive layer 212 is arranged on a surface of the second insulating layer 23 away from the substrate 001. The at least one first stretching signal line 201 is distributed in the first conductive layer 211, the at least one second stretching signal line 202 is distributed in the second conductive layer 212. The orthographic projections of the first stretching signal line 201 and the second stretching signal line 202 on the substrate 001 do not overlap.

In this embodiment, the materials of the first insulating layer 22 and the second insulating layer 23 may include organic materials, such as polymethyl methacrylate and polystyrene general-purpose polymers, polymer derivatives based on phenol groups, acrylic-based polymers, p-xylene-based polymers, aryl ether-based polymers, amide-based polymers, fluoride-based polymers, p-xylene-based polymers, vinyl alcohol-based polymers or their mixture. The first insulating layer 22 and the second insulating layer 23 using these materials help to protect the first conductive layer 211 and the second conductive layer 212 from breaking.

Further, the elastic stretching unit 02 in this embodiment further includes a third insulating layer 24 and an inorganic protection layer. The third insulating layer 24 is arranged on a side of the second conductive layer 212 away from the substrate 001, and the third insulating layer 24 covers the surface of the second conductive layer 212. The material of the third insulating layer 24 can refer to the selection of the first insulating layer 22 and the second insulating layer 23, and will not be described in detail here. The inorganic protection layer is arranged on a side of the third insulating layer 24 away from the substrate 001 and covers the surface of the third insulating layer 24. The material of the inorganic protection layer may include silicon oxide, silicon nitride or silicon oxynitride, and the like. The inorganic protection layer may be a single-layer or multi-layer laminated structure. For example, the inorganic protection layer may include a first inorganic layer 241 and a second inorganic layer 242, or further include more inorganic layers, which can be adaptively changed according to the manufacturing process of the display panel. It should be noted here that the thickness of the inorganic protection layer is generally thinner than the thickness of the first insulating layer 22, the second insulating layer 23 or the third insulating layer 24, so as to play a protection role while avoiding avulsion during stretching or folding.

Figure 9:
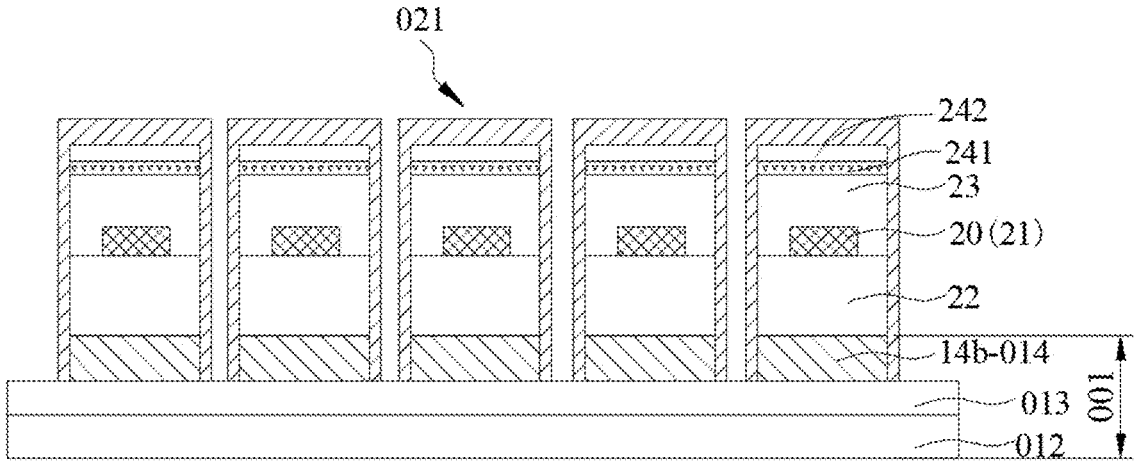
FIG. 9 is a schematic diagram of a film layer structure of an elastic stretching unit in another example embodiment of the present disclosure.

As shown in FIG. 9, in some other embodiments of the present disclosure, the stretch rate of the elastic stretching unit 02 may be increased by dividing the stretchable display unit 01 into a plurality of sub-stretching units 021. The elastic stretching unit 02 includes a plurality of sub-stretching units 021 spaced from each other. Each sub-stretching unit 021 includes at least one stretching signal line 20 and at least one conductive layer 21. The at least one stretching signal line 20 is distributed in the at least one conductive layer 21. Each conductive layer 21 includes at most one stretching signal line 20, that is, each conductive layer 21 of each sub-stretching unit 021 contains only one stretching signal line 20. When the sub-stretching unit 021 only includes one conductive layer 21, the sub-stretching unit 021 includes only one stretching signal line 20. In this embodiment, the elastic stretching unit 02 is divided into a plurality of sub-stretching units 021, and the sub-stretching units 021 are distributed apart, which can better release the stress released by the display panel during stretching to a certain extent.

A sub-stretching unit 021 may include one, two or more conductive layers 21. When two or more conductive layers 21 are included, the conductive layers 21 are insulated from each other. In a specific embodiment, the sub-stretching unit 021 includes a conductive layer 21, and the conductive layer 21 includes a stretching signal line 20. In this embodiment, the sub-stretching unit 021 further includes a first insulating layer 22 and a second insulating layer 23. The first insulating layer 22 is arranged between the substrate 001 and the conductive layer 21, and the second insulating layer 23 is arranged on the side of the conductive layer 21 away from the substrate 001. The materials of the first insulating layer 22 and the second insulating layer 23 include organic materials, which can be selected according to the materials of the insulating layers in the above embodiments, and will not be described in detail here.

In some embodiments, the sub-stretching unit 021 may further include an inorganic protection layer arranged on a side of the second insulating layer 23 away from the substrate 001. Similarly, the material and structure of the inorganic protection layer can refer to the description regarding the inorganic protection layer in the above-mentioned embodiments. For example, the material of the inorganic protection layer may include silicon oxide, silicon nitride, or silicon oxynitride. The inorganic protection layer may be a single layer or a multi-layer laminated structure, for example, the inorganic protection layer may include a first inorganic layer 241 and a second inorganic layer 242, or may include further more inorganic layers.

Figure 8:
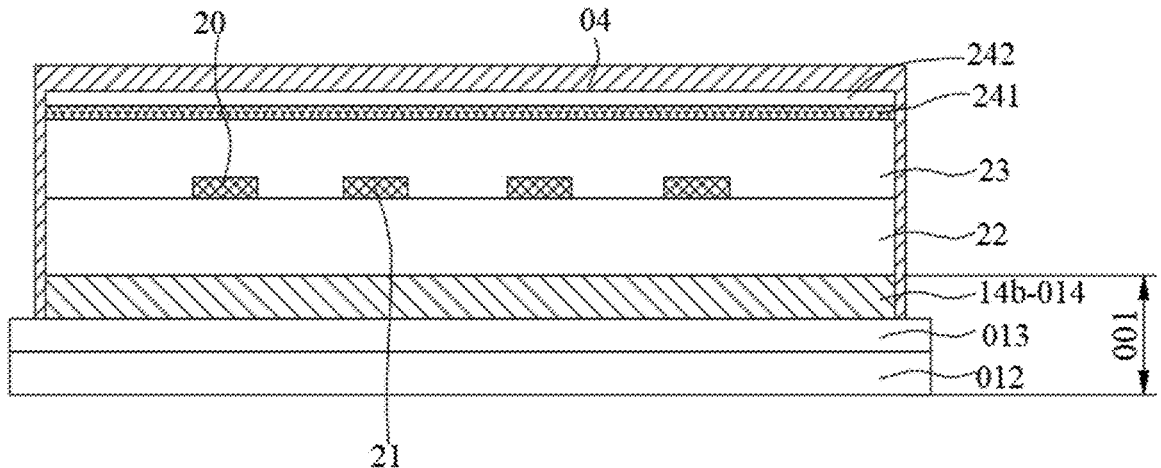
FIG. 8 is a schematic diagram of a film layer structure of an elastic stretching unit in another example embodiment of the present disclosure.

Alternatively, in some embodiments of the present disclosure, the film layer structure of the elastic stretching unit 02 may also be other structure(s), such as only including one conductive layer 21, and multiple stretching signal lines 20 being distributed in the conductive layer 21. For details, please refer to the structure shown in FIG. 6 and FIG. 8. In the embodiments shown in FIG. 6 and FIG. 8, the elastic stretching unit 02 includes a first insulating layer 22, a conductive layer 21, a second insulating layer 23, a first inorganic layer 241 and a second inorganic layer 242 which are sequentially stacked. A plurality of signal lines 20 are distributed in the conductive layer 21. In this case, the stretch rate of the display panel can be improved by changing the structure or shape of the display units 01, or the shape of the elastic stretching units 02.

In some embodiments of the present disclosure, a display unit 01 is a multi-layer structure, which may include one or more sub-pixels. The film layer structure of the display unit 01 can be various. For example, the structure can be as shown in FIG. 4 to FIG. 6, or as shown in FIG. 13 to FIG. 15, which is not limited in embodiments of the present disclosure.

Figure 5:
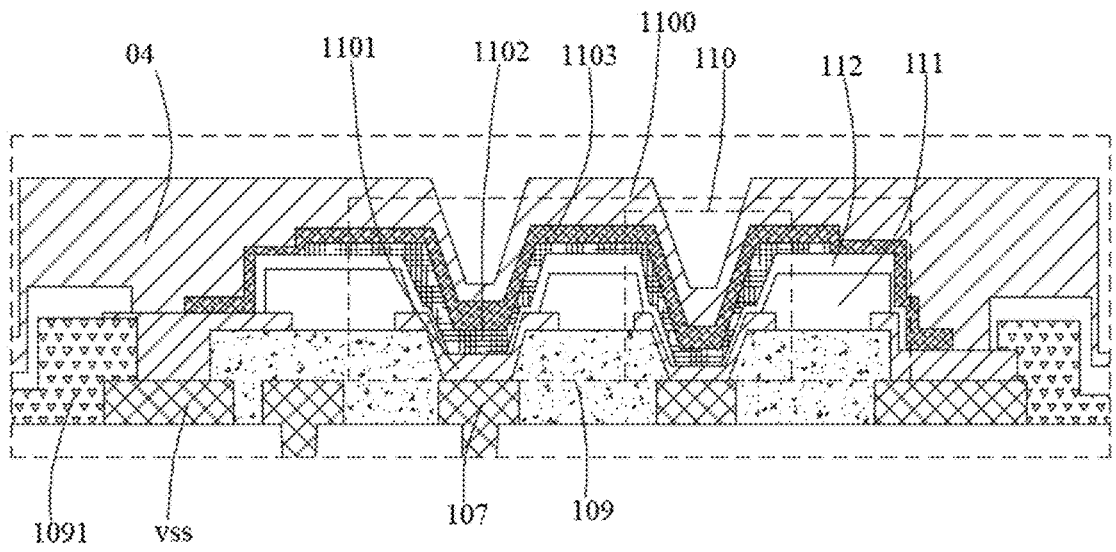
FIG. 5 is an enlarged view of part D in FIG. 4.
Figure 13:
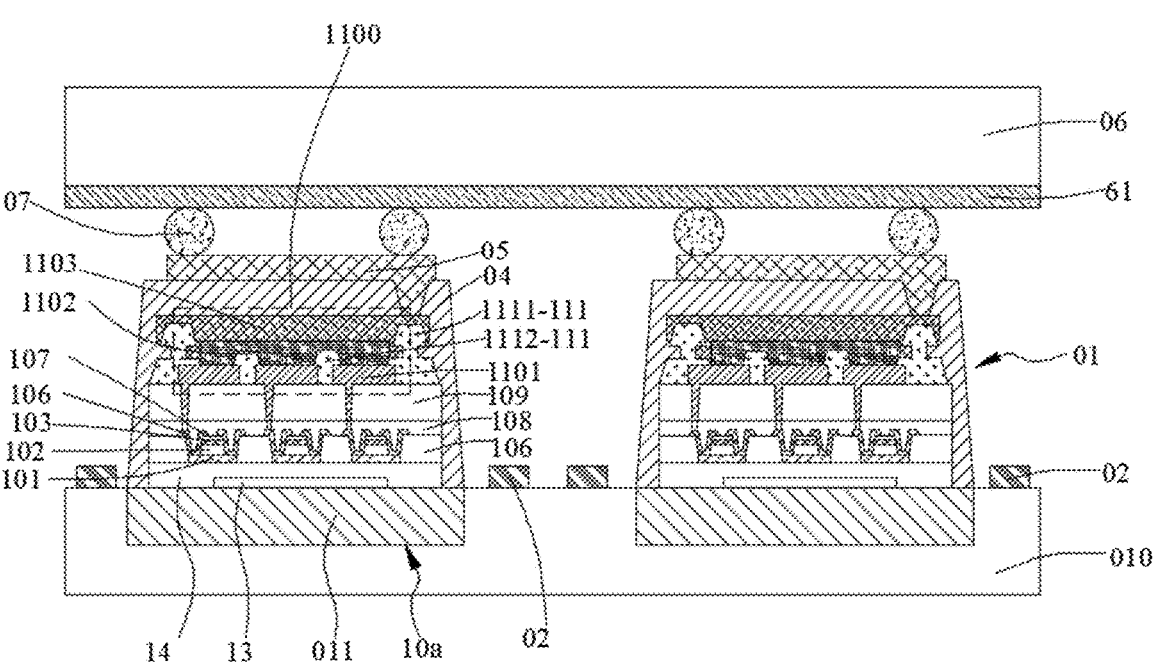
FIG. 13 is a schematic diagram of a film layer structure of a display panel in an example embodiment of the present disclosure.
Figure 14:
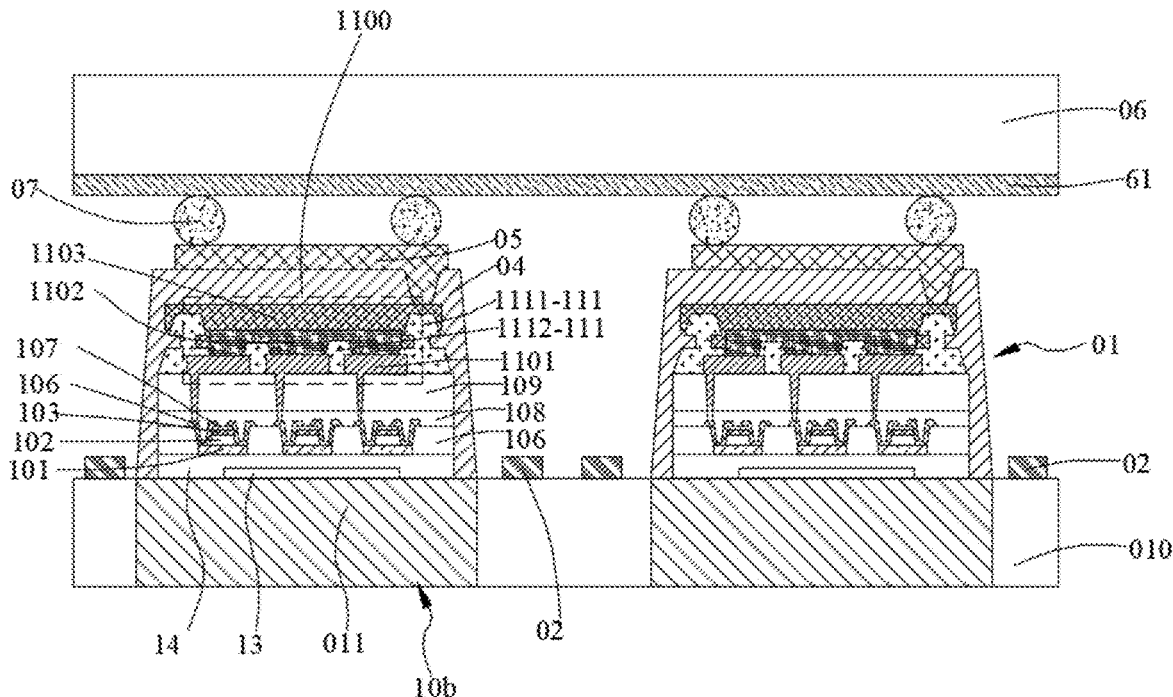
FIG. 14 is a schematic diagram of a film layer structure of a display panel in another example embodiment of the present disclosure.
Figure 15:
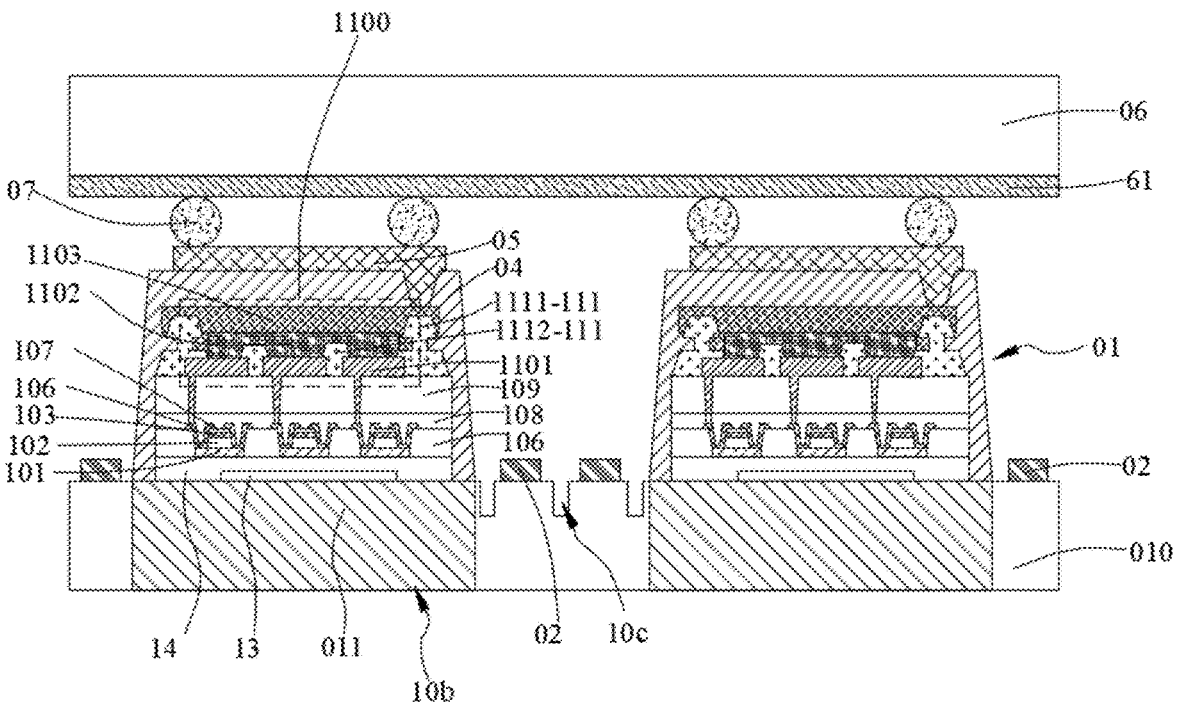
FIG. 15 is a schematic diagram of a film layer structure of a display panel in another example embodiment of the present disclosure.

As shown in FIGS. 4 to 6, FIG. 5 is an enlarged view of part D in FIG. 4, or as shown in FIGS. 13 to 15, a display unit 01 includes a driving circuit layer 10 and a light-emitting layer 11. The driving circuit layer 10 is arranged on a side of the substrate 001. The light-emitting layer 11 is arranged on a side of the driving circuit layer 10 away from the substrate 001. The light-emitting layer 11 includes a pixel-defining structure 111 and at least one light-emitting device 110. The pixel-defining structure 111 defines at least one sub-pixel region, and each sub-pixel region is provided with one light-emitting device 110.

The driving circuit layer 10 includes a driving circuit, and the driving circuit includes a pixel circuit. The pixel circuit is used to drive the light-emitting device 110 of the display panel to emit light. The pixel circuit may be a pixel circuit such as 7T1C, 7T2C, 6T1C or 6TC, and its structure is not specifically limited here, wherein nTmC indicates that a pixel circuit includes n transistors (indicated by the letter "T") and m capacitors (indicated by the letter "C"). The pixel circuits are connected to the light-emitting devices 110 in a one-to-one correspondence to drive the light-emitting devices 110 to emit light.

In some embodiments of the present disclosure, a light-emitting device 110 includes a first electrode layer 1101, a light-emitting functional layer 1102 and a second electrode layer 1103 which are sequentially stacked along a direction away from the substrate 001.

The first electrode layer 1101 is arranged on a side of the driving circuit layer 10 away from the substrate 001. The size of the sub-pixel region(s) defined by the pixel-defining structure 111 can expose a part of the first electrode layer 1101. The orthographic projection of a sub-pixel region on the substrate 001 may be polygonal or curved, which is not specifically limited. The first electrode layer 1101 may serve as an anode of the light-emitting device 110. The first electrode layer 1101 can be made of a transparent conductive material, such as indium tin oxide (ITO), indium zinc oxide (IZO) or the like. The first electrode layer 1101 may be a single-layer or multi-layer structure, which is not limited in embodiments of the present disclosure.

The light-emitting functional layer 1102 is arranged on a side of the first electrode layer 1101 away from the substrate 001. The light-emitting functional layer 1102 is a multilayer structure. Along the direction away from the substrate 001, the light-emitting functional layer 1102 includes: a hole injection layer, a hole transport layer, a light-emitting material layer, and an electron transport layer. The holes and electrons are recombined into excitons in the light-emitting material layer, and the excitons radiate photons to produce visible light. The specific light-emitting principle will not be described in detail here. The light-emitting material layer may be an organic light-emitting material layer or a quantum dot light-emitting material layer. In some embodiments, the light-emitting functional layer 1102 may further include an electron injection layer arranged on a side of the electron transport layer away from the substrate 001. The display unit 01 may include multiple light-emitting devices 110, and light-emitting devices 110 in a single display unit 01 may share the same light-emitting functional layer 1102, or may use their own light-emitting functional layers 110, which is not limited in embodiments of the present disclosure.

The second electrode layer 1103 is arranged on a side of the light-emitting functional layer 1102 away from the substrate 001. The second electrode layer 1103 may serve as a cathode of the light-emitting device 110. The second electrode layer 1103 may be a single-layer or multi-layer structure, and its material may include one or more of conductive metal, metal oxide and alloy thereof. The thickness of the second electrode layer 1103 may be 100-500 nm, and alternatively, the thickness of the second electrode layer 1103 may also be in other thickness ranges, which is not limited in embodiments of the present disclosure.

A display unit 01 may include multiple light-emitting devices 110, and light-emitting devices 110 in a single display unit 01 may share the same cathode, that is, share the same second electrode layer 1103. As shown in FIG. 5, in a single display unit 01, the second electrode layer 1103 of light-emitting devices 110 is integrated, which is a continuous conductive layer covering the light-emitting functional layers 1102 and the pixel-defining structures 111 of the light-emitting devices 110. That is to say, the orthographic projection of the second electrode layer 1103 on the substrate 001 in a single display unit 01 covers orthographic projections of the sub-pixels and the pixel-defining structure 111 on the substrate 001. Also, the second electrode layer 1103 is recessed into a sub-pixel region at a place corresponding to the sub-pixel region, that is, the second electrode layer 1103 is recessed in a direction close to the substrate 001 at the place corresponding to the sub-pixel region.

Multiple light-emitting devices 110 included in a single display unit 01 may form a light-emitting device group 1100, and the light-emitting device groups 1100 of different display units 01 may share the same second electrode layer 1103 or not share the same second electrode layer 1103. For example, in one embodiment, the second electrode layer 1103 of the light-emitting device groups 1100 of display units 01 is a whole continuous conductive layer 21. In another embodiment, the second electrode layers 1103 of the light-emitting device groups 1100 of display units 01 are separated from each other.

As shown in FIG. 5, in some embodiments of the present disclosure, the light-emitting layer 11 may further include a first electrode covering layer 112. The first electrode covering layer 112 covers the surface of the pixel-defining structure 111 and an end of the first electrode layer 1101 close to the pixel-defining structure 111. That is, the first electrode covering layer 112 covers the edge region of the first electrode layer 1101 exposed by the pixel-defining structure 111, and the first electrode covering layer 112 exposes the middle region of the first electrode layer 1101 exposed by the pixel-defining structure 111. This structural design helps to reduce the influence of the uneven film thickness in the edge region of the light-emitting device 110 on the display effect.

As shown in FIG. 4, FIG. 6, and FIG. 13 to FIG. 15, in some embodiments of the present disclosure, the driving circuit layer 10 may be formed by a multi-layer film structure. Taking a transistor in the driving circuit being a top-gate thin film transistor as an example, the driving circuit layer 10 includes: an active layer 101, a first gate insulating layer 102, a first gate metal layer 103, a second gate insulating layer 104, a second gate metal layer 105, an interlayer dielectric layer 106, and a first source and drain layer 107. It should be noted here that, in the embodiments shown in FIGS. 13 to 15, the second gate insulating layer 104 and the second gate metal layer 105 are not shown due to different cross-sectional positions.

The active layer 101 is arranged on a side of the substrate 001. The first gate insulating layer 102 is arranged on a side of the active layer 101 away from the substrate 001, and the first gate insulating layer 102 covers the active layer 101. The first gate metal layer 103 is arranged on a side of the first gate insulating layer 102 away from the substrate 001, the first gate metal layer 103 includes a first electrode plate of a capacitor C and a gate of the transistor. The second gate insulating layer 104 is arranged on a side of the first gate metal layer 103 away from the substrate 001 and the second gate insulating layer 104 covers the first gate metal layer 103. The second gate metal layer 105 is arranged on a side of the first gate insulating layer 102 away from the substrate 001, and is arranged opposite to the first electrode plate. The second gate metal layer 105 includes a second electrode plate of the capacitor C. The interlayer dielectric layer 106 is arranged on a side of the second gate metal layer 105 away from the substrate 001, and the interlayer dielectric layer 106 covers the second gate metal layer 105. The source and drain layer 107 is arranged on a side of the interlayer dielectric layer 106 away from the substrate 001. The first source and drain layer 107 includes a source and a drain of the transistor, and the source and drain are connected to the active layer 101.

As shown in FIG. 4 and FIG. 6, in some embodiments of the present disclosure, the first source and drain layer 107 further includes a plurality of signal lines. The signal lines include a voltage signal line VSS, and the voltage signal line VSS is connected to the second electrode layer 1103, for transmitting a voltage signal to the second electrode layer 1103 of the light-emitting device 110. It should be noted here that, in addition to the voltage signal line VSS, the first source and drain layer 107 may further include other signal lines, such as scan signal lines, light-emitting control signal lines, data lines, reset signal lines, etc., which are not limited in embodiments of the present disclosure. The signal lines in the display units 01 and the stretching signal lines 20 in the elastic stretching units 02 can be connected to form a complete signal line, so as to jointly provide various signals for each sub-pixel in the display unit 01.

Figure 16:
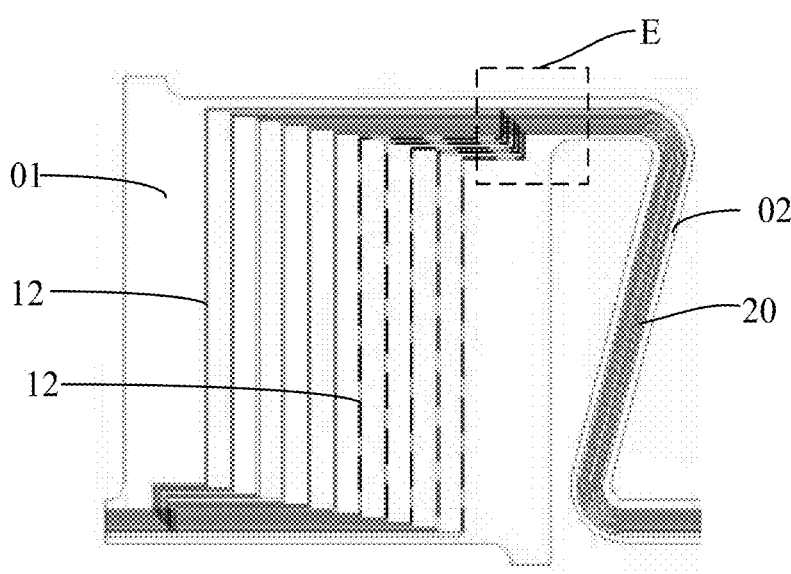
FIG. 16 is a schematic diagram of stretching signal lines and a distribution structure of signal lines in an example embodiment of the present disclosure.

As shown in FIG. 1, FIG. 4 and FIG. 16, in some embodiments of the present disclosure, when an elastic stretching unit 02 includes at least two conductive layers 21 that are insulated from each other, the thickness of an insulating layer between two adjacent conductive layers 21 gradually decreases in a extending direction from the elastic stretching unit 02 to the display unit 01. At the connection contact point between the elastic stretching unit 02 and the display unit 01, the thickness of the insulating layer between two adjacent conductive layers 21 is reduced to 0. That is, the insulation layer between two adjacent conductive layers 21 is generally thick in the middle and thin at both ends in the extending direction of the elastic stretching unit 02. That is, in a region of the elastic stretching unit 02 close to the display unit 01, the insulating layer between two adjacent conductive layers 21 is thinner, and the closer to the region of the display unit 01, the thickness becomes thinner. For a specific illustration, reference may be made to the thickness variation manner of the second insulating layer 23 on the right side in FIG. 4. At the joint between the elastic stretching unit 02 and the display unit 01, the thickness is zero. It should be noted here that the joint refers to a region range, not a specific connection point, such as the region range indicated by E in FIG. 16. The multiple stretching signal lines 20 in the elastic stretching unit 02 extend to the inside of the display unit 01 to form multiple signal lines 12 in the display unit 01. The plurality of signal lines 12 in the display unit 01 are arranged in a tiled manner spaced from each other in a direction parallel to a plane where the substrate 001 is located. That is, the plurality of signal lines 12 in the display unit 01 may be arranged in the same layer. In the structure shown in FIG. 16, the signal lines 12 of different line shapes are located in different conductive layers in the elastic stretching unit 02. In this embodiment, the number of film layer structures in the display unit 01 can be reduced as much as possible, which helps to reduce the thickness of the display panel to a certain extent.

As shown in FIG. 4, FIG. 6, and FIG. 13 to FIG. 15, in some embodiments of the present disclosure, the driving circuit layer 10 further includes a planarization layer 109 located between the first source and drain layer 107 and the light-emitting layer 11. The material of the planarization layer 109 may include an organic insulating material, and its specific selection may refer to the description regarding the first insulating layer 22 in the above-mentioned embodiments.

In addition, as shown in FIG. 4 and FIG. 6, the driving circuit layer 10 may further include a first covering layer 1091 arranged on a side of the first source and drain layer 107 away from the substrate 001. The orthographic projection of the first covering layer 1091 on the substrate 001 is located at the periphery of the orthographic projection of the light-emitting device group 1100 on the substrate 001. That is, the first covering layer 1091 is distributed on the edge of the display panel. The first capping layer 1091 may be in the same layer as the planarization layer 109. The first planarization layer 109 is distributed in the middle region of the display panel, that is, the region where the light-emitting devices 110 are arranged. The first covering layer 1091 is provided with a groove, and this structure has a certain waterproof and water-blocking effect, which is helpful to prevent external water vapor from entering the light-emitting devices 110 and avoid affecting the display effect. The material of the first covering layer 1091 may include an inorganic insulating material layer, and its specific selection may refer to description regarding the inorganic protection layer in the above-mentioned embodiments, and details are not repeated here. Alternatively, the material of the first covering layer 1091 may be selected from an organic insulating material layer, which is not limited in embodiments of the present disclosure. The first electrode covering layer 112 may also cover the surface of the first covering layer 1091. Similarly, the first electrode covering layer 112 may also be provided with a groove to prevent external water vapor from entering the light-emitting devices 110.

As shown in FIGS. 13 to 15, in some embodiments of the present disclosure, the driving circuit layer 10 may further include a passivation layer 108 located between the planarization layer 109 and the first source and drain layer 107. The material of the passivation layer 108 may include an inorganic insulating material layer, and its specific selection may refer to the description regarding the inorganic protection layer in the above-mentioned embodiments, and details are not repeated here.

As shown in FIG. 4, FIG. 6, and FIG. 13 to FIG. 15, in some embodiments, the display panel further includes an encapsulation layer 04, and the encapsulation layer 04 is arranged on a side of the light-emitting layer 11 away from the substrate 001. The encapsulation layer 04 may be used to protect the light-emitting layer 11 and prevent water and oxygen from outside from corroding the light-emitting devices 110. In some embodiments of the present disclosure, thin-film encapsulation (TFE) may be used to achieve encapsulation. Specifically, the encapsulation layer 04 may be formed by one or more inorganic layers, and the material may be single-layer or multi-layer inorganic layer(s) such as silicon oxide, silicon oxynitride, or silicon nitride, or dense film layers such as aluminum oxide, aluminum nitride, titanium nitride.

In the present disclosure, there may be multiple ways to transmit the voltage signal to the second electrode layer 1103. In addition to the methods shown in FIG. 4 and FIG. 6, in some embodiments of the present disclosure, other interconnect layer(s) located on a side of the light-emitting layer 11 away from the substrate 001 can be used to provide a voltage signal for the second electrode layer 1103.

As shown in FIGS. 13 to 15, in some embodiments, the display panel further includes a first connecting conductor layer 05 and a cover plate 06.

The first connecting conductor layer 05 is arranged on a side of the encapsulation layer 04 away from the substrate 001, and the first connecting conductor layer 05 is connected to the second electrode layer 1103. Specifically, the first connecting conductor layer 05 may be a transparent conductive layer, and its material may be selected from mesh conductive metal or transparent conductive material, such as indium tin oxide (ITO), indium zinc oxide (IZO), or the like. The first connecting conductor layer 05 is connected to the second electrode layer 1103 through a via hole.

The cover plate 06 is arranged on a side of the first connecting conductor layer 05 away from the substrate 001. The cover plate 06 may be made of a transparent flexible material, such as Polydimethylsiloxane (PMDS). The cover plate 06 is provided with a second connecting conductor layer 61, and the second connecting conductor layer 61 is located on a side of the cover plate 06 close to the substrate 001. The second connecting conductor layer 61 is connected to the first connecting conductor layer 05, and the second connecting conductor layer 61 is used for transmitting a voltage signal. The second connecting conductor layer 61 may be connected to an external power supply to supply electricity to the cathode of the light-emitting device(s) 110. The second connecting conductor layer 61 may be a transparent conductive layer, and its material may be selected from mesh conductive metal or transparent conductive material, such as indium tin oxide (ITO), indium zinc oxide (IZO), or the like.

In this embodiment, the first connecting conductor layer 05 on the encapsulation layer 04 (the side away from the substrate 001) is used as an interconnect layer, and is connected to the external power supply through the second connecting conductor layer 61, so as to provide electricity to the cathode of the light-emitting device(s) 110. This kind of structural design helps to reduce the frame width of the periphery of the light-emitting device group 1100 in the display unit 01, and further helps to improve the display quality of the display panel. For example, in the case that the ratio of the sum of the areas of the multiple hollow regions 03 to the total area of the display panel is fixed, this embodiment helps to realize a narrow frame design of the display unit 01, so that the number of sub-pixels in the display unit 01, that is, the number of light-emitting devices 110 in the display unit 01, can be increased, thereby helping to improve the display effect of the display panel. Alternatively, when the number of sub-pixels of the display panel is fixed, it is also helpful to reduce the area of the display unit

01, thereby increasing the area of the hollow regions 03 and improving the stretch rate of the display panel.

In some embodiments of the present disclosure, the display panel further includes at least one conductive ball 07, and the second connecting conductor layer 61 is connected to the first connecting conductor layer 05 through the at least one conductive ball 07. The at least one conductive ball 07 has a more excellent conductive effect. The material of the conductive ball 07 may be selected from conductive metal, metal alloy or transparent conductive material. The orthographic projection of the conductive ball 07 on the substrate 001 may be located within the orthographic projection of the pixel-defining structure 111 on the substrate 001. Certainly, when the conductive ball 07 is a transparent structure, the specific position of the conductive ball 07 is not limited.

In some embodiments of the present disclosure, the structure of the second electrode layer 1103 between display units 01 may be improved by changing the specific shape of the pixel-defining structure 111.

As shown in FIGS. 13 to 15, in some embodiments, all the light-emitting devices in each display unit 01 form a light-emitting device group 1100. The pixel-defining structure 111 includes a first defining structure 1111 arranged on the periphery of the light-emitting device group 1100.

The first defining structure 1111 may have various shapes. In some embodiments of the present disclosure, in a direction perpendicular to the plane where the substrate 001 is located, the orthographic projection of a bottom end of the first defining structure 1111 on the substrate 001 is located within the orthographic projection of the middle or top end of the first defining structure 1111 on the substrate 001. The bottom end of the first defining structure 1111 is an end close to the substrate 001, the top end is an end away from the substrate 001, and the middle is the part between the bottom and top ends. In this embodiment, the first defining structure 1111 is generally wide at the top or middle and narrow at the bottom. When forming the second electrode layer 1103 using this structure, the second electrode layer 1103 is likely to be broken at the first defining structure 1111, so as to separate the second electrode layers 1103 in the display units 01, reducing the possibility of breakage of the film layer structure during the stretching procedure of the display panel. For example, in a direction perpendicular to the plane where the substrate 001 is located, the cross section of the first defining structure 1111 is an inverted trapezoid.

Figure 17:
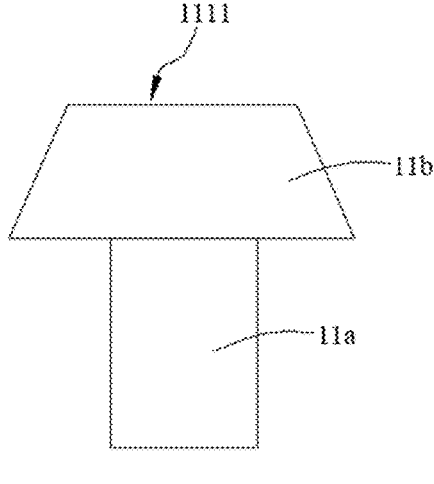
FIG. 17 is a schematic diagram of a first defining structure in an example embodiment of the present disclosure.
Figure 18:
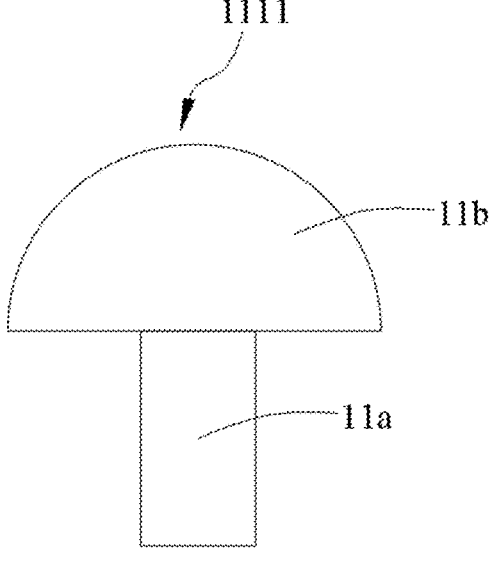
FIG. 18 is a schematic diagram of a first defining structure in another example embodiment of the present disclosure.

As shown in FIG. 17 and FIG. 18, in some other embodiments, along a direction away from the substrate 001, the first defining structure 1111 includes a first defining portion 11a and a second defining portion 11b connected to each other. The first defining portion 11a is connected to a side of the second defining portion 11b close to the substrate. The orthographic projection of the first defining portion 11a on the substrate 001 is located within the orthographic projection of the second defining portion 11b on the substrate 001, and the area of the orthographic projection of the first defining portion 11a on the substrate 001 is smaller than the area of the orthographic projection of the second defining portion 11b on the substrate 001. In a direction perpendicular to the plane where the substrate 001 is located, the cross-section of the second defining portion 11b may be polygonal or semi-curved, such as regular trapezoid, inverted trapezoid, semicircle or semiellipse. In a specific embodiment, in a direction perpendicular to the plane where the substrate 001 is located, the cross section of the first defining structure 1111 is approximately mushroom-shaped.

As shown in FIG. 13 to FIG. 15, in some embodiments of the present disclosure, the pixel-defining structure 111 further includes at least one second defining structure 1112. Each second defining structure 1112 is arranged between two adjacent light-emitting devices 110 in each display unit 01. In the direction of the plane where the substrate 001 is located, the height of the first defining structure 1111 is greater than the height of the second defining structure 1112. With this kind of structural design, when the second electrode layer 1103 is formed, the second electrode layer 1103 is prone to breakage at the first defining structure 1111, and is less likely to break at the second defining structure 1112, so that the second electrode layer 1103 between the display units 01 is split, and a complete second electrode layer 1103 is formed inside each display unit 01, which facilitates the power supplying for the second electrode layer 1103 of the light-emitting device 110, and reduces the possibility of film layer structure breakage during stretching of the display panel. The second defining structure 1112 can have various shapes. For example, in a direction perpendicular to the plane where the substrate 001 is located, a part of the cross section of the second defining structure 1112 is a regular trapezoid or a semi-curved edge shape.

As shown in FIG. 4, FIG. 6 and FIG. 13 to FIG. 15, in some embodiments of the present disclosure, a display unit 01 further includes a light shielding layer 13 and a buffer layer 14. The light shielding layer 13 is arranged between the substrate 001 and the driving circuit layer 10, and the buffer layer 14 is arranged between the light shielding layer 13 and the driving circuit layer 10.

In embodiments of the present disclosure, the display units 01, the elastic stretching units 02 and the substrate 001 may be freely combined to form display panels with different film layer structures. As shown in FIGS. 13 to 15, the structures of the substrate 001 are different, forming display panels with different film layer structures.

As shown in FIG. 1 to FIG. 3, in embodiments of the present disclosure, a plurality of display units 01 are arranged in an array, and two adjacent display units 01 are connected by an elastic stretching unit 02. One display unit 01 may be connected with a plurality of elastic stretching units 02. For example, an elastic stretching unit 02 may be connected between surfaces of two adjacent display units 01 that are adjacent and face each other. As shown in FIG. 1 and FIG. 3, a display unit 01 is roughly a quadrangular structure, each side of which may be connected to one elastic stretching unit 02, that is, the quadrangular display unit 01 may be connected to four elastic stretching units 02. The other ends of the four elastic stretching units 02 are respectively connected to other display units 01 located around the display unit 01. As another example, the display unit 01 is roughly circular in structure. As shown in FIG. 2, a part of the display units are roughly circular. Other display units may be distributed around such display units, e.g., three, four, five or more. Such display unit (roughly circular) may be correspondingly connected to three, four, five or more elastic stretching units 02. In this way, display units 01 are connected by the elastic stretching units 02 to form a network structure. Hollow regions 03 are formed between the display units 01 and the elastic stretching units 02.

In some embodiments of the present disclosure, at least a partial area of an elastic stretching unit 02 is a curved structure. The curved structure helps to increase the stretch rate of the elastic stretching unit 02.

The specific shape of the elastic stretching unit 02 will be illustrated below in combination with different embodiments.

Figure 19:
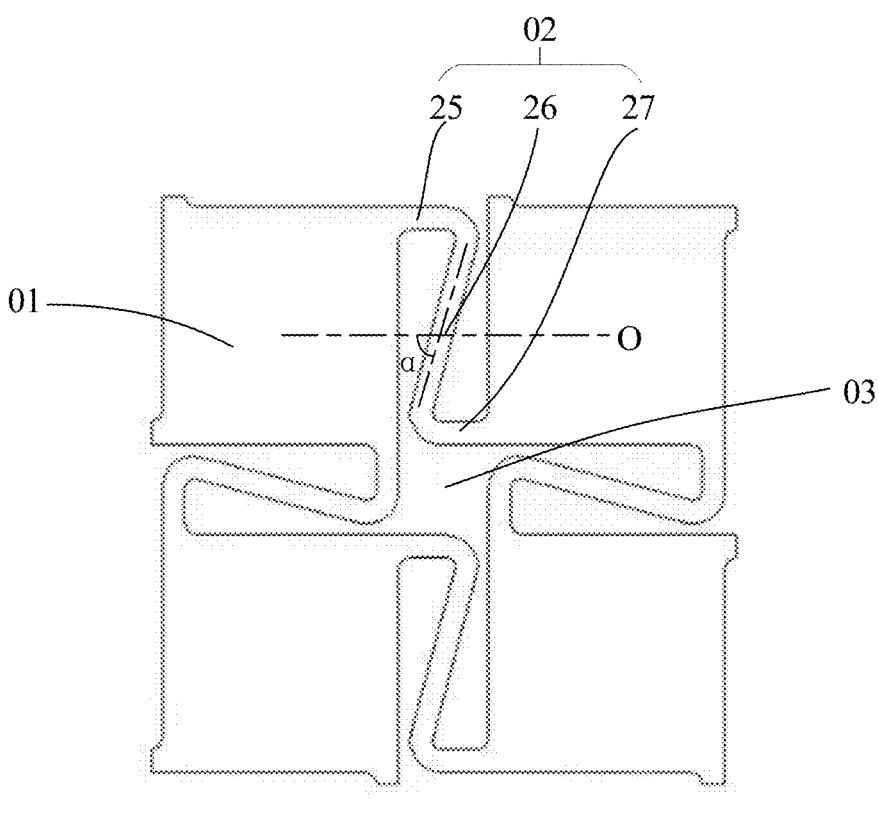
FIG. 19 is a schematic structural diagram of a display unit and an elastic stretching unit in an example embodiment of the present disclosure.

As shown in FIG. 1 and FIG. 19, in some embodiments of the present disclosure, two adjacent display units 01 are arranged along a first direction. It should be noted here that the first direction can be changed along with the arrangement direction of two adjacent display units 01. For example, when two adjacent display units 01 are arranged along a row direction, the first direction is the row direction. When two adjacent display units 01 are arranged along a column direction, the first direction is the column direction. In addition, the first direction may also be other directions except the row direction and the column direction.

The elastic stretching unit 02 includes a first connecting portion 25, a second connecting portion 26 and a third connecting portion 27 which are smoothly connected in sequence. The first connecting portion 25 and the third connecting portion 27 extend along the first direction. The first connecting portion 25 has a first connecting end, and the third connecting portion 27 has a second connecting end. The first connecting end is connected to one of the two adjacent display units 01, and the second connecting end is connected to the other one of the two adjacent display units 01. The first connecting end and the second connecting end are located at both sides of a center point connecting line O for connecting the center points of two adjacent display units 01. The elastic stretching unit 02 is respectively connected to two adjacent display units 01 through the first connecting end and the second connecting end.

The extending direction of the second connecting portion 26 is not perpendicular to the center point connecting line O for connecting the center points of two adjacent display units 01. The angle $\alpha$ between the extending direction of the second connecting portion 26 and the center point connecting line connecting the center points of two adjacent display units 01 may be an acute angle. In this case, the length of the second connecting portion 26 in its extending direction is relatively long, which helps to increase the stretch rate of the elastic stretching unit 02. The second connecting portion 26 may be linear or curved, which is not limited in embodiments of the present disclosure. For example, the second connecting portion 26 is linear, and the angle between the extending direction of the second connecting portion 26 and the center point connecting line connecting the center points of two adjacent display units 01 is $\alpha$, $45° \leq \alpha < 90°$.

Further, the elastic stretching unit 02 may be a centrally symmetrical structure. The symmetrical central point of the elastic connecting unit is located on the center point connecting line for connecting central points of the two adjacent display units 01.

In such an embodiment, the shape of the display unit 01 is not limited. In a specific embodiment, the display unit 01 is a quadrilateral, such as a square, a rectangle, a rhombus, and the like.

Figure 20:
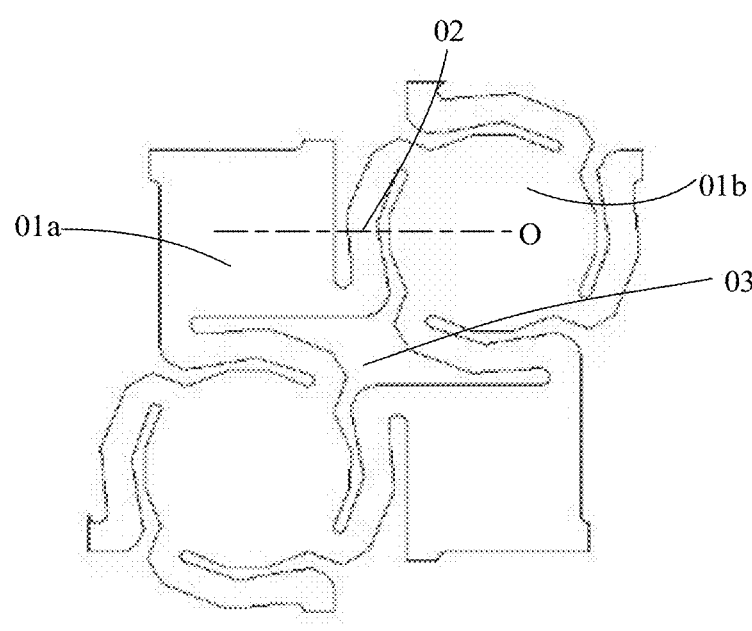
FIG. 20 is a schematic structural diagram of a display unit and an elastic stretching unit in another example embodiment of the present disclosure.

As shown in FIG. 2 and FIG. 20, in some other embodiments of the present disclosure, the plurality of display units 01 include a plurality of first display units 01a and a plurality of second display units 01b. The plurality of second display units 01b are respectively connected to the first display units 01a through elastic stretching units 02, and the second display units 01b are spaced from the first display unit 01a. The edge of a first display unit 01a is linear, and the edge of a second display unit 01b is curved. For example, the first display unit 01a is polygonal, such as a quadrangle, and the second display unit 01b is roughly circular.

In this embodiment, the elastic stretching unit 02 has a first connecting end and a second connecting end. The first connecting end is connected to the first display unit 01a in the adjacent first display unit 01a and second display unit 01b. The second connecting end is connected to the second display unit 01b in the adjacent first display unit 01a and second display unit 01b. The first connecting end and the second connecting end are located at both sides of a center point connecting line O for connecting center points of adjacent first display unit 01a and second display unit 01b. At least a partial region of the elastic stretching unit 02 is a curved structure extending along the bending direction of the edge of the second display unit 01b. That is, a partial region of the elastic stretching unit 02 is a curved structure, and the bending extending direction of the curved structure is substantially the same as the bending direction of the edge of the second display unit 01b.

Figures 21, 22:
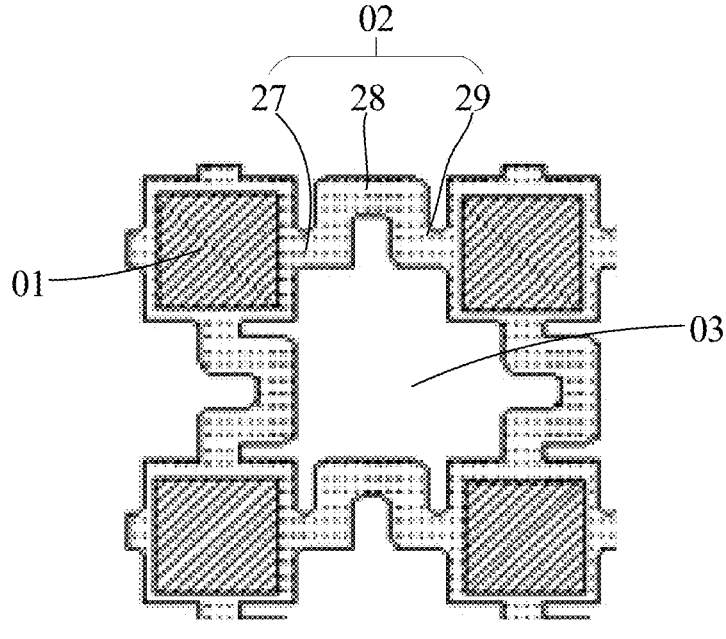
FIG. 21 is a schematic structural diagram of a display unit and an elastic stretching unit in another example embodiment of the present disclosure.
FIG. 22 is a schematic structural diagram of a display unit and an elastic stretching unit in another example embodiment of the present disclosure.

As shown in FIG. 3 and FIG. 21, in some other embodiments of the present disclosure, two adjacent display units 01 are arranged along a first direction. Similarly, the first direction can be changed according to the arrangement direction of two adjacent display units 01. For example, when two adjacent display units 01 are arranged along a row direction, the first direction is a row direction. When two adjacent display units 01 are arranged along a column direction, the first direction is a column direction. In addition, the first direction may also be other directions except the row direction and the column direction.

The elastic stretching unit 02 includes a third connecting portion 27, a fourth connecting portion 28 and a fifth connecting portion 29 which are smoothly connected in sequence. The third connecting portion 27 and the fifth connecting portion 29 extend along the first direction. The third connecting portion 27 has a third connecting end, and the fifth connecting portion 29 has a fourth connecting end. The third connecting end is connected to one of the two adjacent display units 01, and the fourth connecting end is connected to the other one of the two adjacent display units. The third connecting end and the fourth connecting end are located on the center point connecting line for connecting the center points of the two adjacent display units 01. The fourth connecting portion 28 is a curved structure.

In any one of the above-mentioned embodiments, the elastic stretching units 02 of different shapes may be configured as a structure including a plurality of sub-stretching units 021, as shown in FIG. 22. It should be noted here that the drawings of the present disclosure only exemplarily show a schematic diagram of the shape of an elastic stretching unit 02 including sub-stretching units 021, and the elastic stretching unit 02 including the sub-stretching units 021 may also be in other shapes, and embodiments of the present disclosure do not impose specific limitations on this.

As shown in FIG. 1 to FIG. 3, in some embodiments of the present disclosure, a hollow region 03 is set at the center of four display units 01 distributed in a square shape. In the embodiments shown in FIG. 1 and FIG. 2, a hollow region 03 is in windmill-shaped. The center point of the hollow region 03 coincides with the center point of the four display units 01 distributed in a square shape.

In the present disclosure, solutions in any of the above embodiments can be combined freely, and are not limited to the embodiments shown in the drawings.

It should be understood that the present disclosure does not limit its application to the detailed structures and arrangements of components set forth in the specification. The present disclosure can have other embodiments and can be practiced and carried out in various ways. The variations and modifications fall within the scope of the present disclosure. It should be understood that the disclosure disclosed and defined in the specification extends to all alternative combinations of two or more of individual features mentioned or evident in the text and/or drawings. All of these different combinations constitute alternative aspects of the present disclosure. The embodiments described herein describe the best mode known for carrying out the present disclosure and will enable those skilled in the art to utilize the present disclosure.

What is claimed is:

1. A display panel comprising:
a substrate;
a plurality of display units arranged on a side of the substrate, wherein each of the plurality of display units comprises at least one sub-pixel;
a plurality of elastic stretching units arranged on a side of the substrate, wherein each of the plurality of elastic stretching units is connected between two adjacent display units, and a plurality of hollow regions are formed between the plurality of elastic stretching units and the plurality of display units;
wherein a sum of areas of the plurality of hollow regions is a, a sum of areas of the plurality of display units is b, and a sum of areas of the plurality of elastic stretching units is c;

$$15\% \leqslant a/(a+b+c) \times 100\% \leqslant 30\%;$$

wherein the elastic stretching units comprise a plurality of stretching signal lines and at least two conductive layers insulated from each other;
wherein the plurality of stretching signal lines are distributed at least in two of the at least two conductive layers conductive layers.

2. The display panel according to claim 1, wherein, in a direction parallel to a plane where the substrate is located, stretching signal lines distributed in different ones of the conductive layers are staggered.

3. The display panel according to claim 1, wherein each of the elastic stretching units comprises:
a first insulating layer arranged on a side of the substrate;
a first conductive layer arranged on a side of the first insulating layer away from the substrate;
a second insulating layer arranged on a side of the first conductive layer away from the substrate, wherein the second insulating layer covers a surface of the first conductive layer;
a second conductive layer arranged on a side of the second insulating layer away from the substrate; and
the stretching signal lines comprising a first stretching signal line and a second stretching signal line, wherein the first stretching signal line is distributed in the first conductive layer, and the second stretching signal line is distributed in the second conductive layer, orthographic projections of the first stretching signal line and the second stretching signal line on the substrate do not overlap.

4. The display panel according to claim 1, wherein at least one of the elastic stretching units comprises a plurality of sub-stretching units spaced from each other, and each of the plurality of sub-stretching units comprises at least one of the stretching signal lines and at least one of the conductive layers, the at least one of the stretching signal lines is distributed in the at least one of the conductive layers, and each of the conductive layers comprises at most one stretching signal line.

5. The display panel according to claim 4, wherein each of the plurality of sub-stretching units comprises one conductive layer, and the conductive layer comprises one stretching signal line;

wherein each of the plurality of sub-stretching units comprises further comprises:
a first insulating layer arranged between the substrate and the conductive layer; and
a second insulating layer arranged on a side of the conductive layer away from the substrate.

6. The display panel according to claim 1, wherein each of the display units comprises:
a driving circuit layer arranged on one side of the substrate; and
a light-emitting layer arranged on a side of the driving circuit layer away from the substrate, wherein the light-emitting layer comprises a pixel-defining structure and at least one light-emitting device;
wherein the pixel-defining structure defines at least one sub-pixel region, and each of the at least one sub-pixel region is provided with one of the at least one light-emitting device.

7. The display panel according to claim 6, wherein each of the at least one light-emitting device comprises a first electrode layer, a light-emitting functional layer and a second electrode layer which are sequentially stacked along a direction away from the substrate;
wherein the driving circuit layer comprises:
an active layer arranged on a side of the substrate;
a first gate insulating layer arranged on a side of the active layer away from the substrate, wherein the first gate insulating layer covers the active layer;
a first gate metal layer arranged on a side of the first gate insulating layer away from the substrate, wherein the first gate metal layer comprises a first electrode plate of a capacitor and a gate of a transistor;
a second gate insulating layer arranged on a side of the first gate metal layer away from the substrate, wherein the second gate insulating layer covers the first gate metal layer;
a second gate metal layer arranged on a side of the first gate insulating layer away from the substrate and arranged opposite to the first electrode plate, wherein the second gate metal layer comprises a second electrode plate of the capacitor;
an interlayer dielectric layer arranged on a side of the second gate metal layer away from the substrate, wherein the interlayer dielectric layer covers the second gate metal layer;
a first source and drain layer arranged on a side of the interlayer dielectric layer away from the substrate, wherein the first source and drain layer comprises a source and a drain of a transistor, and the source and drain are connected to the active layer;
wherein the first source and drain layer further comprises a plurality of signal lines, the signal lines comprise a voltage signal line, and the voltage signal line is connected to the second electrode layer.

8. The display panel according to claim 7, wherein when each of the elastic stretching units comprises at least two conductive layers insulated from each other, a thickness of an insulating layer between two adjacent ones of the at least two conductive layers is gradually thinned in an extending direction from the elastic stretching unit to a corresponding display unit;
wherein the plurality of stretching signal lines in each of the elastic stretching units extend to inside of the display unit to form the plurality of the signal lines in the display unit;

wherein the plurality of signal lines located in the display unit are arranged in a tiled manner spaced from each other in a direction parallel to a plane where the substrate is located.

9. The display panel according to claim 6, wherein each of the at least one light-emitting device comprises a first electrode layer, a light-emitting functional layer and a second electrode layer which are sequentially stacked along a direction away from the substrate;
wherein the display panel further comprises:
an encapsulation layer arranged on a side of the light-emitting layer away from the substrate;
a first connecting conductor layer arranged on a side of the encapsulation layer away from the substrate, wherein the first connecting conductor layer is connected to the second electrode layer;
a cover plate arranged on a side of the first connecting conductor layer away from the substrate, wherein the cover plate is provided with a second connecting conductor layer, the second connecting conductor layer is located on a surface of the cover plate close to the substrate, the second connecting conductor layer is connected to the first connecting conductor layer, and the second connecting conductor layer is used for transmitting a voltage signal.

10. The display panel according to claim 9, wherein the display panel further comprises at least one conductive ball, and the second connecting conductor layer is connected to the first connecting conductor layer through the at least one conductive ball.

11. The display panel according to claim 6, wherein all light-emitting devices in each display unit form a light-emitting device group;
wherein the pixel-defining structure comprises:
a first defining structure arranged on the periphery of the light-emitting device group;
wherein in a direction perpendicular to a plane where the substrate is located, an orthographic projection of a bottom end of the first defining structure on the substrate is located within an orthographic projection of a middle or top end of the first defining structure on the substrate.

12. The display panel according to claim 11, wherein the pixel-defining structure further comprises:
at least one second defining structure, each of which is arranged between two adjacent light-emitting devices in a corresponding one of the display units;
wherein in the direction perpendicular to the plane where the substrate is located, a height of the first defining structure is greater than a height of the least one second defining structure second defining structure.

13. The display panel according to claim 6, wherein all light-emitting devices in each display unit form a light-emitting device group;
wherein the pixel-defining structures comprise:
a first defining structure arranged on the periphery of the light-emitting device group, wherein the first defining structure comprises a first defining portion and a second defining portion connected to each other, the first defining portion is connected to a side of the second defining portion close to the substrate, an orthographic projection of the first defining portion on the substrate is located within an orthographic projection of the second defining portion on the substrate, and an area of the orthographic projection of the first defining portion on the substrate is smaller than an area of the orthographic projection of the second defining portion on the substrate.

14. The display panel according to claim 1, wherein at least a partial region of the elastic stretching units is a curved structure.

15. The display panel according to claim 14, wherein two adjacent display units are arranged along a first direction;
wherein:
each of the elastic stretching units comprises a first connecting portion, a second connecting portion and a third connecting portion which are smoothly connected in sequence;
the first connecting portion and the third connecting portion extend along the first direction;
the first connecting portion has a first connecting end, the third connecting portion has a second connecting end, the first connecting end is connected to one of the two adjacent display units, the second connecting end is connected to the other one of the two adjacent display units, and the first connecting end and the second connecting end are located at both sides of a center point connecting line for connecting center points of the two adjacent display units;
a extending direction of the second connecting portion is not perpendicular to the center point connecting line for connecting the center points of the two adjacent display units.

16. The display panel according to claim 14, wherein the plurality of the display units comprise:
a plurality of first display units; and
a plurality of second display units which are respectively connected to the first display units through the elastic stretching units, wherein the second display units and first display units are spaced from each other;
wherein an edge of each of the first display units is linear, and an edge of each of the second display units is curved.

17. The display panel according to claim 16, wherein:
each of the elastic stretching units has a first connecting end and a second connecting end;
the first connecting end is connected to a first display unit in the first display unit and a second display unit which are adjacent;
the second connecting end is connected to the second display unit in the first display unit and the second display unit which are adjacent;
the first connecting end and the second connecting end are at both sides of a center point connecting line for connecting center points of the first display unit and the second display unit;

each of the elastic stretching units has at least a partial region which is a curved structure extending along a bending direction of the edge of the second display unit.

18. The display panel according to claim 14, wherein two adjacent display units are arranged along a first direction;
wherein:
each of the elastic stretching units comprises a third connecting portion, a fourth connecting portion and a fifth connecting portion that are smoothly connected in sequence;
the third connecting portion and the fifth connecting portion extend along the first direction;
the third connecting portion has a third connecting end, the fifth connecting portion has a fourth connecting end, the third connecting end is connected to one of the two adjacent display units, the four connecting end is connected to the other one of the two adjacent display units, and the third connecting end and the fourth connecting end are located on a center point connecting line for connecting center points of the two adjacent display units;
the fourth connecting portion is a curved structure.

19. A display device, comprising a display panel,
wherein the display panel comprises:
a substrate;
a plurality of display units arranged on a side of the substrate, wherein each of the plurality of display units comprises at least one sub-pixel;
a plurality of elastic stretching units arranged on a side of the substrate, wherein each of the plurality of elastic stretching units is connected between two adjacent display units, and a plurality of hollow regions are formed between the plurality of elastic stretching units and the plurality of display units;
wherein a sum of areas of the plurality of hollow regions is a, a sum of areas of the plurality of display units is b, and a sum of areas of the plurality of elastic stretching units is c;

$$15\% \leqslant a/(a + b + c) \times 100\% \leqslant 30\%;$$

wherein the elastic stretching units comprise a plurality of stretching signal lines and at least two conductive layers insulated from each other;
wherein the plurality of stretching signal lines are distributed at least in two of the at least two conductive layers conductive layers.

* * * * *